(12) United States Patent
Song et al.

(10) Patent No.: US 10,120,401 B2
(45) Date of Patent: Nov. 6, 2018

(54) SYSTEM FOR REAL TIME POWER GRID DISTRIBUTION NETWORK CONTROL

(71) Applicant: Accenture Global Services Limited, Dublin (IE)

(72) Inventors: Zitong Song, Beijing (CN); Zhihui Yang, Beijing (CN); Qin Zhou, Beijing (CN)

(73) Assignee: Accenture Global Services Limited, Dublin (IE)

( * ) Notice: Subject to any disclaimer, the term of this patent is extended or adjusted under 35 U.S.C. 154(b) by 312 days.

(21) Appl. No.: 15/056,532

(22) Filed: Feb. 29, 2016

(65) Prior Publication Data

US 2016/0179118 A1    Jun. 23, 2016

Related U.S. Application Data

(63) Continuation of application No. PCT/CN2013/082718, filed on Aug. 30, 2013.

(51) Int. Cl.
 *G05D 11/00* (2006.01)
 *G05F 1/66* (2006.01)
 (Continued)

(52) U.S. Cl.
 CPC .............. *G05F 1/66* (2013.01); *G05B 15/02* (2013.01); *H02J 3/006* (2013.01); *H02J 3/14* (2013.01);
 (Continued)

(58) Field of Classification Search
 CPC .... G05F 1/66; G05B 15/02; H02J 3/14; H02J 3/006; Y02E 60/74; Y04S 20/222; Y04S 10/30; Y02B 70/3225; G01R 19/2513
 (Continued)

(56) References Cited

U.S. PATENT DOCUMENTS 8,041,464 B2 * 10/2011 Solo .................. G06N 5/04
  345/644
2005/0012395 A1  1/2005 Eckroad et al.
  (Continued)

FOREIGN PATENT DOCUMENTS

EP    2 330 726 A2    6/2011

OTHER PUBLICATIONS

Written Opinion, dated May 21, 2014, pp. 1-5, PCT Application No. PCT/CN2013/082718, State Intellectual Property Office of the P.R. China (ISA/CN), Beijing, China.
(Continued)

*Primary Examiner* — Vu A Vu
(74) *Attorney, Agent, or Firm* — Brinks Gilson & Lione

(57) ABSTRACT

A system for power grid distribution network control can monitor a power grid distribution network in real-time, detect an abnormal loading condition based on real-time measurements on the distribution network, and perform in real time, in response to the detected abnormal loading condition, a reconfiguration analysis of the distribution network. The reconfiguration analysis can be performed based on heuristic logic that combines real time depth first trace and breadth first division of nodes within the distribution system. Through the reconfiguration analysis process, the system can generate and implement a practical and optimized reconfiguration plan in real time so as to alleviate or eliminate an abnormal loading condition in time to prevent possible pre-matured failures of equipment and consequently save cost of equipment replacement and/or related power outages. Accordingly, the distribution network may operate with improved stability and reliability, and a cost of operation can be reduced.

20 Claims, 14 Drawing Sheets

(51) Int. Cl.
*H02J 3/00* (2006.01)
*H02J 3/14* (2006.01)
*G05B 15/02* (2006.01)
*G01R 19/25* (2006.01)

(52) U.S. Cl.
CPC ....... *G01R 19/2513* (2013.01); *Y02B 70/3225* (2013.01); *Y02E 60/74* (2013.01); *Y04S 10/30* (2013.01); *Y04S 20/222* (2013.01)

(58) Field of Classification Search
USPC ........................................................ 700/295
See application file for complete search history.

(56) References Cited

U.S. PATENT DOCUMENTS

| | | | |
|---|---|---|---|
| 2008/0088183 A1 | 4/2008 | Eckroad et al. | |
| 2010/0219808 A1 | 9/2010 | Steckley et al. | |
| 2011/0133558 A1 | 6/2011 | Park | |
| 2012/0296489 A1* | 11/2012 | Lee | H02J 3/008 700/297 |
| 2013/0175867 A1 | 7/2013 | Park | |
| 2013/0346057 A1* | 12/2013 | Lin | H02J 3/00 703/18 |
| 2015/0032278 A1* | 1/2015 | Bhageria | H02J 4/00 700/295 |
| 2015/0102674 A1* | 4/2015 | Rudolph | H02J 3/381 307/52 |

OTHER PUBLICATIONS

International Search Report, dated Jun. 5, 2014, pp. 1-4, PCT Application No. PCT/CN2013/082718, State Intellectual Property Office of the P.R. China (ISA/CN), Beijing, China.

\* cited by examiner

SYSTEM FOR REAL TIME POWER GRID DISTRIBUTION NETWORK CONTROL

PRIORITY

This application is a continuation of PCT/CN2013/082718, filed Aug. 30, 2013, which is incorporated herein by reference.

TECHNICAL FIELD

Embodiments of the present disclosure relate to the field of power grid technology and more particularly to a system for real time power grid distribution network control.

BACKGROUND

Various industries have networks associated with them. One such industry is the utility industry that manages a power grid. The power grid may include one or all of the following: electricity generation, electric power transmission, and electricity distribution. Electricity may be generated using generating stations, such as a coal fire power plant, a nuclear power plant, etc. For efficiency purposes, the generated electrical power is stepped up to a very high voltage (such as, for example, 345K Volts) and transmitted over transmission lines. The transmission lines may transmit the power long distances, such as across state lines or across international boundaries, until it reaches its wholesale customer, which may be a company that owns the local distribution network. The transmission lines may terminate at a transmission substation, which may step down the very high voltage to an intermediate voltage (such as, for ex ample, 138K Volts). From a transmission substation, smaller transmission lines (such as, for example, sub-transmission lines) transmit the intermediate voltage to distribution substations. At the distribution substations, the intermediate voltage may be again stepped down to a "medium voltage" (such as, for example, from 4K Volts to 23K Volts). One or more feeder circuits may emanate from the distribution substations. For example, four to tens of feeder circuits may emanate from the distribution substation. The feeder circuit is a 3-phase circuit comprising 4 wires (three wires for each of the 3 phases and one wire for neutral). Feeder circuits may be routed either above ground (on poles) or underground. The voltage on the feeder circuits may be tapped off periodically using distribution transformers, which step down the voltage from "medium voltage" to the consumer voltage (such as, for example, 120V). The consumer voltage may then be used by the consumers.

Currently, real time situational awareness of the status of distribution network may not be available. Thus, a distribution network often runs a high risk for power outages or blackouts. Actually, there are many causes that might result in a power failure, such as power demand outstripping power supply, faults at power stations, faulty lines or devices, short circuiting, device's heavy-loading or over-loading operations for a long time, etc. Moreover, with an increasing demand for the electricity, the heavy-loading and over-loading of the distribution equipment can happen more often than before. The heavy-loading or over-loading might lead to a temperature rise in the insulation system and damage of the insulation materials, and lead to increase in failure risk of the equipment, which in turn could result in a pre-mature failure and further affect reliability of the grid. However, at present, the Distribution Management System (DMS) of many power utility companies cannot collect all loading information of the entire network (such as the loading information of distribution transformers), which means the heavy-loading or over-loading may not be identified and handled in time.

SUMMARY OF THE DISCLOSURE

According to an aspect of the present disclosure, there is provided a system for real time power grid distribution network control. The system may comprise: at least one processor; and at least one memory storing computer executable instructions. The at least one memory and the computer executable instructions may be configured to, with the at least one processor, cause the system to: monitor in real time a power grid distribution network by receipt and real time analysis of measured power parameters of the power grid distribution network, detect an abnormal loading condition in a distribution network based on the real-time analysis of the measured power parameters on the distribution network; and perform, in response to the detected abnormal loading condition resulting from excessive real power, a reconfiguration analysis of the distribution network and generate a reconfiguration plan for the detected abnormal loading condition. The reconfiguration analysis process is performed based on a heuristic logic method combining both depth first trace and breadth first division.

According to another aspect of the present disclosure, there is provided a method for real time power grid distribution network control. The method may comprise: detecting an abnormal loading condition in a power grid distribution network based on real-time measurements of power parameters within the distribution network; and performing, in response to the detected abnormal loading condition resulting from excessive real power, a reconfiguration analysis process on the distribution network to generate a reconfiguration plan for the detected abnormal loading condition. The reconfiguration analysis process is performed based on heuristic logic which combines both depth first trace and breadth first division in real-time within the nodes of the distribution network.

According to a further aspect of the present disclosure, there is provided an apparatus for real time power grid distribution network control. The apparatus may comprise means for detecting an abnormal loading condition in a distribution network based on real-time measurements on the distribution network; and means for performing, in response to the detected abnormal loading condition resulting from excessive real power, a reconfiguration analysis of the distribution network to obtain a reconfiguration plan for the detected abnormal loading condition. The means for performing is configured to perform the reconfiguration analysis process based on a heuristic logic combining in real time both depth first trace and breadth first division within the nodes of the distribution network.

According to a yet further aspect of the present disclosure, there is provided another apparatus for real time power grid distribution network control. The apparatus may comprise a loading condition detection module configured to detect an abnormal loading condition in a distribution network based on real-time measurements on the distribution network; and an analysis process performing module configured to perform, in response to the detected abnormal loading condition resulted from excessive real power, a reconfiguration analysis process on the distribution network to obtain a reconfiguration plan for the detected abnormal loading condition. The analysis process performing module may be configured to perform the reconfiguration analysis process based on a heuristic logic method combining both depth first trace and breadth first division.

According to a still yet further aspect of the present disclosure, there is provided a tangible computer-readable medium having a plurality of instructions executable by a processor to control in real time a power grid distribution network. The tangible computer-readable medium may comprise instructions configured to perform steps of the method according to the second aspect of present disclosure.

With embodiments of the present disclosure, an abnormal loading condition can be detected based on real-time measurements, and through the reconfiguration analysis process, the system can develop a practical and optimized reconfiguration plan with balanced loading transfer and less switching operations, so as to alleviate or even eliminate the detected abnormal loading condition in time to prevent possible pre-mature failures of equipment and consequently save cost of equipment replacement and the power outage. Accordingly, the distribution network may operate with improved stability and reliability, and operation cost may be reduced.

BRIEF DESCRIPTION OF THE DRAWINGS

The above and other features of the present disclosure will become more apparent through detailed explanation on the embodiments as illustrated in the embodiments with reference to the accompanying drawings wherein like reference numbers represent same or similar components throughout the accompanying drawings of the present disclosure, wherein.

DETAILED DESCRIPTION OF EMBODIMENTS

Hereinafter, embodiments of the present disclosure will be described with reference to the accompanying drawings. In the following description, numerous specific details are set forth in order to provide a thorough understanding of the embodiments. However, it is apparent to the skilled in the art that implementation of the present disclosure may not have these details and the present disclosure is not limited to the particular embodiments as introduced herein. On the contrary, any arbitrary combination of the following features and elements may be considered to implement and practice the present disclosure, regardless of whether they involve different embodiments. Thus, the following aspects, features and embodiments are only for illustrative purposes, and should not be understood as elements or limitations of the appended claims, unless otherwise explicitly specified in the claims. Additionally, in some instances, well known methods and structures have not been described in detail so as not to unnecessarily obscure the embodiments of the present disclosure.

Figure 1:
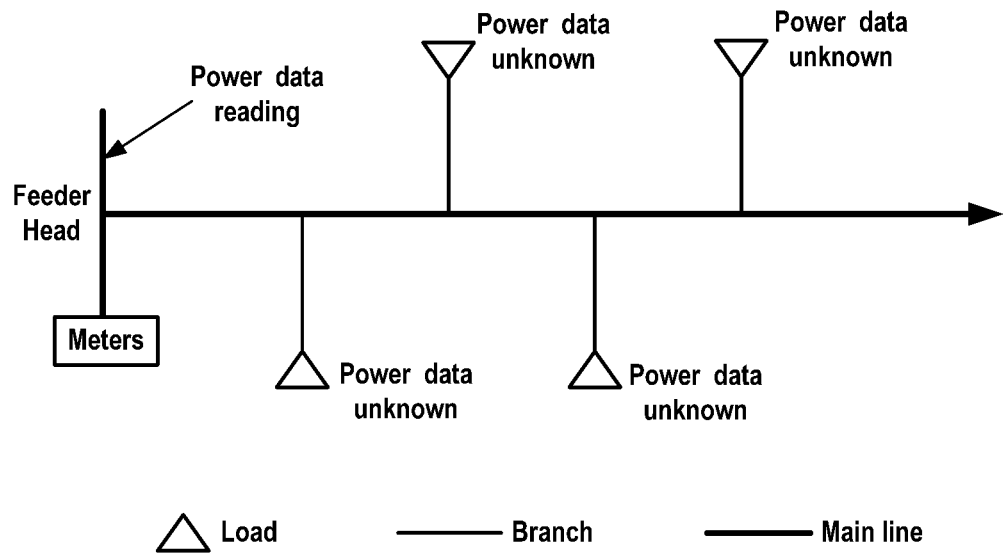
FIG. 1 schematically illustrates a diagram of a distribution network model in a conventional metering manner.

As mentioned before, since the Distribution Management System (DMS) can not collect all loading information of the entire network in the prior art, conditions (especially loading conditions) of equipments in the distribution network can not be obtained and thus abnormal loading conditions can not be identified and addressed in time. FIG. 1 schematically illustrates a diagram of a conventional distribution network model. As illustrated in FIG. 1, in the network distribution, meters for measuring power data are arranged at head of the main line and thus power data for loads located in branches are unknown and can not be obtained by system operator in real time. Therefore, traditionally, load data for power flow calculation is obtained through estimation, which means results of power flow calculation for each branch is not accurate and therefore the obtained loading situation of the distribution network is not accurate. Just for this reason, the system operator don not trust results of power flow calculation as well as the loading condition relating to the network reliability issues.

However, power companies have attempted to upgrade the power grid to be a "smart grid" by applying the state-of-the-art information technology (IT) and power engineering technologies. With the development of the smart grid, a large number of utilities are deploying Advanced Metering Infrastructure (AMI), Phase Measurement Unit (PMU) and other online metering equipment. Hence, in the present disclosure, a new network model for overall network loading condition awareness is disclosed, which will be described with reference to FIG. 2.

Figure 2:
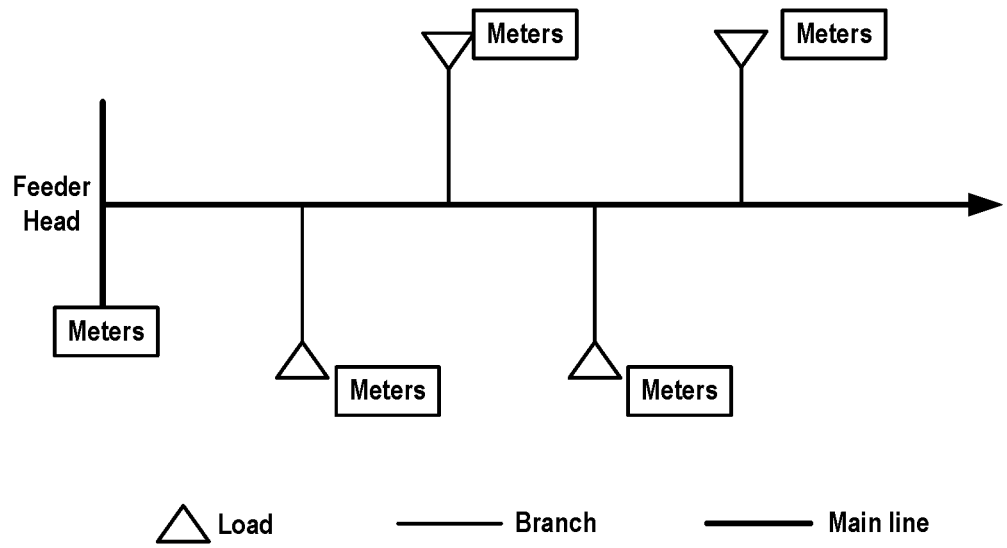
FIG. 2 schematically illustrates an exemplary network model for overall network loading condition awareness according to an embodiment of the present disclosure.

Reference is made to FIG. 2, which schematically illustrates a network model for overall network loading condition awareness according to an embodiment of the present disclosure. As illustrated in FIG. 2, the model is based on online metering system such as AMI, that is to say, beside the head of the feeder, meters are also installed at the location of end-use customers so as to obtain the corresponding power data. Thus, in the illustrated model, the exact power data may be obtained in real time or quasi real time. In such a way, it is possible to monitor loading conditions in real-time or quasi real time. Thus, when an abnormal loading condition occurs in the distribution network, the system may take measures to alleviate or even eliminate the abnormal loading condition so that the distribution equipment can be operated in a reasonable state, a possibility for the outage may be reduced and in turn the electricity network's reliability may be guaranteed.

Next, a method for distribution network reconfiguration as proposed in the present disclosure will be described with reference to FIG. 3, which schematically illustrates a flow chart of a method for distribution network reconfiguration according to an embodiment of the present disclosure.

Figure 3:
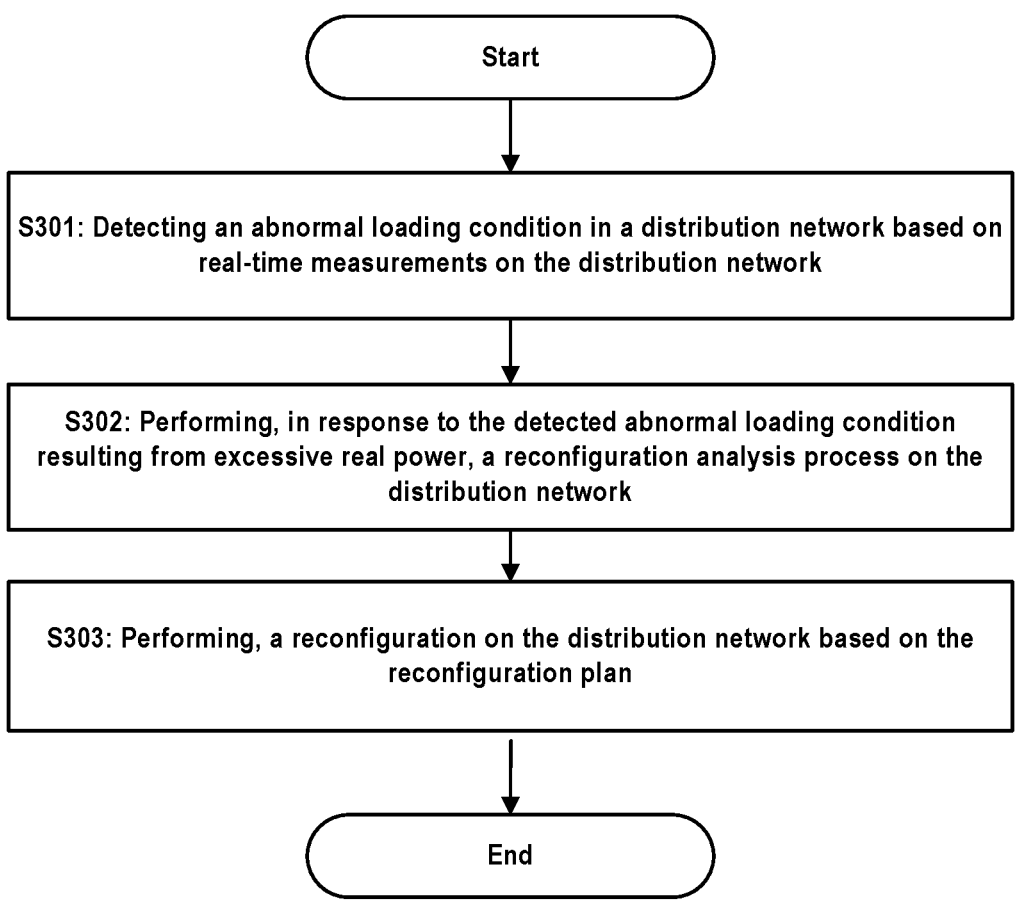
FIG. 3 schematically illustrates a flow chart of a method for distribution network reconfiguration according to an embodiment of the present disclosure.

As illustrated in FIG. 3, first as step S301, an abnormal loading condition in a distribution network may be detected based on real-time measurements on the distribution network.

Figure 4:
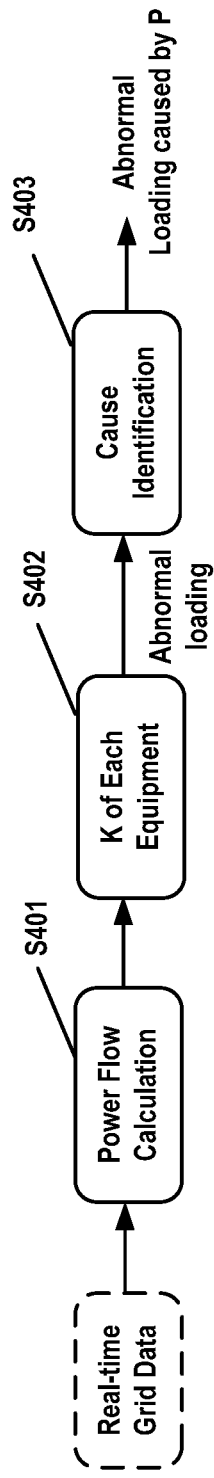
FIG. 4 schematically illustrates a flow chart of a method for detecting an abnormal loading condition according to an embodiment of the present disclosure.

In the network model for overall network loading condition awareness as proposed in the present disclosure, the measurements on the distribution network may be obtained in real time, and thus the system provides a possibility to monitor the loading conditions in real time or quasi real time. The measurements may be data obtained directly from the online metering equipments such as AMI or data from real-time database for the online metering system. Hereinafter, description will be made regarding detection and control of abnormal loading conditions from the real-time measurements with reference to FIG. 4.

First, at step S401, based on real-time grid data obtained from for example AMI, power flow calculation may be performed. The power flow calculation may be implemented by any power flow calculation algorithms such as, impedance algorithm, Newton-Raphson algorithm, and P-Q decomposition, so as to obtain active power p and reactive power q in the distribution network, especially active power p and reactive power q of each equipment in the distribution network. These power flow calculation algorithms are well known in the art and thus the detailed description about the power flow calculation will be omitted so as to not obscure the present disclosure.

Thus, through the power data calculation, it may obtain the active power p and the reactive power q of each equipment. Based on the obtained active power p and reactive power q, a loading factor K may be calculated for each equipment at step S402. Herein, the loading factor K is a measurement of loading conditions, if it is higher than a predetermined threshold, then it may indicate an abnormal loading condition. The loading factor may be calculated for example as follows:

$$K = \frac{\sqrt{p^2 + q^2}}{S_r}$$ (Equation 1)

wherein K denotes the loading factor; p denotes active power of each equipment in the distribution network; q denotes reactive power of each equipment in the distribution network; and $S_r$ denotes rated apparent power of each equipment in the distribution network.

Generally, a threshold for over loading may be set as 1, that is to say, if a loading factor is higher than 1, it indicates an over loading condition in an equipment. Besides, there might be a threshold for a heavy loading condition, which may be set as for example 0.8, and thus if the calculated loading factor is higher than the threshold 0.8, the heavy loading condition is detected. In addition, it should be noted that step S402 may also be a part of power flow calculation, that is to say, step S402 may be incorporate into step S401 and the power flow calculation per see will give the loading factor K without any step of additional loading factor calculation.

Next, at step S403, for the abnormal loading condition, its cause may be identified, i.e., it may be determined whether the abnormal condition is caused by excessive active power (P) or excessive reactive power (Q).

It may be appreciated that the loading factor K is determined by both the active power p and the reactive power q, which means the detected abnormal loading condition may be caused by either a higher value of the active power p or a higher value of the reactive power q. The higher reactive power is resulted from insufficient reactive power compensation in the power grid while the higher active power is resulted by excessive real power demand. For the abnormal loading condition resulted from excessive active power, a load transfer may be performed so as to alleviate or eliminate the abnormal loading condition. Thus, the cause identification may be performed after detecting the abnormal loading condition.

The identification may be determined based on for example the power factor of the equipment. The power factor is a well know factor in the art, which is the ratio of active power to apparent power, i.e., the cosine of the angle between the active power and the apparent power. The power factor may be represented as $$\cos\theta = \frac{p}{\sqrt{p^2 + q^2}}$$ (Equation 2)

wherein cos θ denotes the power factor; p denotes active power of each equipment in the distribution network; q denotes reactive power of each equipment in the distribution network; and $\sqrt{p^2+q^2}$ denotes apparent power of each equipment in the distribution network.

In an embodiment of the present disclosure, there is provided a threshold $\cos\theta_{TH}$ for cause identification. If the calculated power factor cos θ is higher than the threshold $\cos\theta_{TH}$, it means that the abnormal loading condition is caused from excessive active power p; instead, if the calculated power factor cos θ is lower than the threshold $\cos\theta_{TH}$, the abnormal loading condition is caused from excessive reactive power q.

Referring back to FIG. 3, next at step S302, with regard to the abnormal loading condition resulted from excessive real power, the system may perform a reconfiguration analysis process on the distribution network, so as to obtain a reconfiguration plan for the detected abnormal loading condition.

As mentioned hereinabove, for those abnormal loading conditions resulted from excessive real power, the system may perform a load transfer to alleviate or even eliminate the abnormal loading condition. The load transfer means load redistribution in the distribution network when there is a local failure or a failure risk. The load transfer may be implemented by distribution network reconfiguration. The distribution network reconfiguration, which may also be called a distribution feeder reconfiguration, is implemented by changing the states of segment switches and boundary switches so as to implement and select an alternative power supply path to reduce the network loss, eliminate overloading, balance load, and improve the power quality. Detailed description about the reconfiguration analysis process will be provided hereinafter and thus will not be elaborated here.

Then at step S303, a reconfiguration on the distribution network may be performed based on the reconfiguration plan. As soon as the reconfiguration plan is obtained, the system may issue control commands to switches in the reconfiguration plan so as to switch on or off respective switches. The performance of changes to the distribution network configuration by selective switching is well known in the art and thus will not be elaborated herein so as not to obscure the present disclose unnecessarily.

Figure 5:
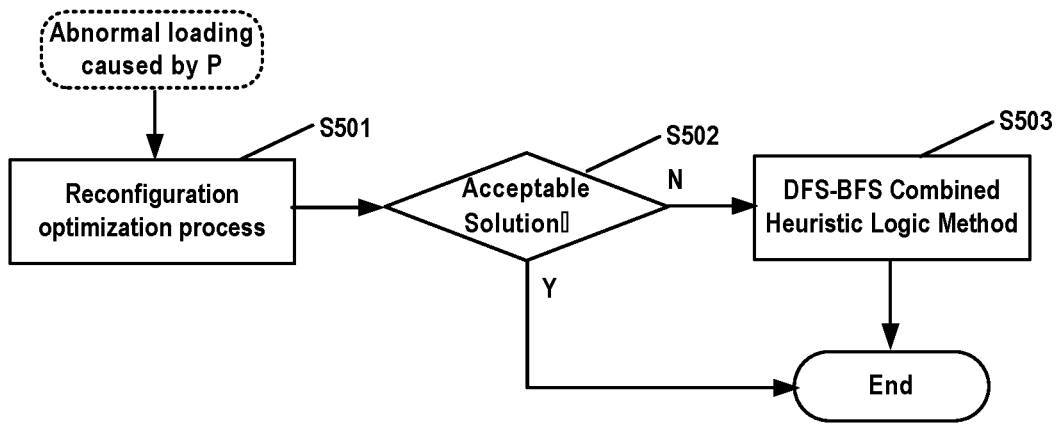
FIG. 5 schematically illustrates a flow chart of a method for performing a reconfiguration analysis process according to an embodiment of the present disclosure.

Next, with reference to FIG. 5, detailed description will made to the reconfiguration analysis process, which may obtain a reconfiguration plan based on which a load transfer may be performed so as to alleviate or even eliminate the abnormal loading condition.

FIG. 5 illustrates a flow chart of performing a reconfiguration analysis process according to an embodiment of the present disclosure. As illustrated, for the abnormal loading condition caused by excessive real power, it may first perform a reconfiguration optimization process at step S501. If it is determined at step S502 that it can obtain an acceptable solution through the reconfiguration optimization process, then the acceptable solution may be taken as the final result and the method ends; otherwise the method may proceed into step S503. At step S503, it may further perform a heuristic logic method combining both a Depth First Trace Search (DFS) and a Breadth First Division Search (BFS), which may be called a DFS-BFS combined heuristic method as well. In such a way, by trial and error the system may generate a practical and optimized reconfiguration plan so as to alleviate the detected abnormal loading condition in time.

Next, reference will made to FIGS. 6 to 12 to describe the reconfiguration optimization process and the DFS-BFS combined heuristic logic method respectively. In the following, it will first describe a linear integration optimization model for the reconfiguration optimization process.

Modeling of the Reconfiguration Optimization Process

Generally, there are three types of objective functions for a reconfiguration optimization process, i.e., minimizing network loss, balancing loads, and fast power restoration. Although these types of objectives functions may be used in the present disclose, herein the objectives will consider alleviating or eliminating the abnormal loading condition with minimum operation times. That is to say, there will be proposed another objective instead, i.e., minimizing the number of switching operations. The objective function may be expressed as follows:

$$\text{Objective: } \min \sum_{l=1}^{m} S_l \quad \text{(Equation 3)}$$

wherein l denotes a line index for a line, m denotes the total number of lines; $S_l$ denotes state change of line l from an initial state $a_{l0}$ to a current state $a_l$ and it is the absolute value between the state $a_{l0}$ and the state $a_l$, that is to say, $S_l=|a_l-a_{l0}|$ If the switch of the line l is opened, the value of the state $a_l$ is 0, otherwise the value of the state $a_l$ is 1.

Besides, there are several constrains for the model which will be described hereinafter one by one.

Switching Times Constraint

The switching times constraint is a constraint to the number of switching operations the system can perform during a reconfiguration plan. That is, the total number of switch operations for the m lines should be limited below a predetermined value, and the predetermined value may be preset by a system operator or dispatcher. The switching times constraint may be expressed as:

$$\sum_{l=1}^{m} S_l \leq \delta \quad \text{(Equation 4)}$$

wherein parameters l, m and $S_l$ are similar to those in equation 3 and $\delta$ denotes the predetermined threshold for the switching times.

Power Flow Balance Constraint

For each node i in the distribution network, the system can meet a power flow balance, in other words, a sum of power flow of lines connected to the node should equal to load on the node. Therefore, a power flow balance constraint may be written as below:

$$\sum_{j} a_{ij} \lfloor b_{ij}(\theta_i - \theta_j) \rfloor = P_{Di}, j \in N(i) \quad \text{(Equation 5)}$$

wherein i denotes a node index for a node; j denotes a node index for another node; $a_{ij}$ denotes connectivity status in node i to node j; $b_{ij}$ is a negative reciprocal of reactance $x_{ij}$ between node i and node j that is to say, $$b_{ij} = -\frac{1}{x_{ij}};$$

$\theta_i$ and $\theta_j$ denote phase angles of voltages at node i and node j respectively; $P_{Di}$ denotes a value of load at the node i. Besides, j belongs to a set of nodes connected with node i, or in other word, node j denotes a node connected with node i.

Line Capacity Constraint

In addition, there may be set a constraint to a maximum line capacity that can be established by the system, by which it may ensure that the obtained solution is avoided from the abnormal loading condition. That line capacity constrain may be expressed by $$a_{ij} \lfloor b_{ij}(\theta_i - \theta_j) \rfloor \leq S_{maxl}, j \in N(i) \quad \text{(Equation 6)}$$

wherein parameters $a_{ij}$, $b_{ij}$, $\theta_i$ and $\theta_j$ are similar to those in equation 5; and $S_{maxl}$ denotes the maximum line capacity for line l between node i and node j.

Network Topology Constraint

It may be appreciated that even after distribution network reconfiguration, the reconfigured network should still meet the original topology, i.e., it still has a radial topology. Thus, that system may have the following topology constraints, which may be based on the graph theory:

$$\beta_{ij} + \beta_{ji} = a_l; \quad \text{(Equation 7)}$$

$$\sum_{i=N(i)} \beta_{ij} = 1, i = 1, \ldots n; \quad \text{(Equation 8)}$$

$$\beta_{0j} = 0, j \in N(0); \quad \text{(Equation 9)}$$

$$\beta_{ij} \in \{0, 1\}, i = 1, \ldots n, j \in N(i) \quad \text{(Equation 10)}$$

wherein $a_l$ denotes connectivity status of line l between node i and node j; and $\beta_{ij}$ denotes whether node j is the parent node of node i; $\beta_{ij}$ denotes whether node i is the parent node of node j. If node j is the parent node of node i, parameter $\beta_{ij}$ will have a value of 1, otherwise, it will have a value of 0. In the above topology constraints, equation 7 denotes that line l can only have one current direction, equation 8 denotes that a node may have one and only one parent node i.e., there is only one power source in the radial network; equation 9 denotes that a main station of the distribution network has no any parent node, and it may be regarded as a power source parent node; equation 10 denotes β is a binary value for all nodes in the distribution network.

It may be seen that the above optimization model is a linear integration optimization problem. Thus, it may be solved by general commercially available optimization software such as IBM ILOG. However, it may be appreciated that the distribution network reconfiguration per se is a nonlinear integration optimization problem, and now it has been converted to a linear one. This means results from the linear integration optimization problem might inviolate some constraints (especially constrains such as maximum line capacity constrain) in practical operations. Therefore, in the present disclosure, there is proposed to further verify the solved result based on real time AC power flow simulation results, and if it is determined from the real time simulation results that there is still an abnormal loading condition, the constraints may be adjusted and the optimization problem can be solved again in real time so as to obtain a solution that will not bring about the over-loading condition.

Figure 6:
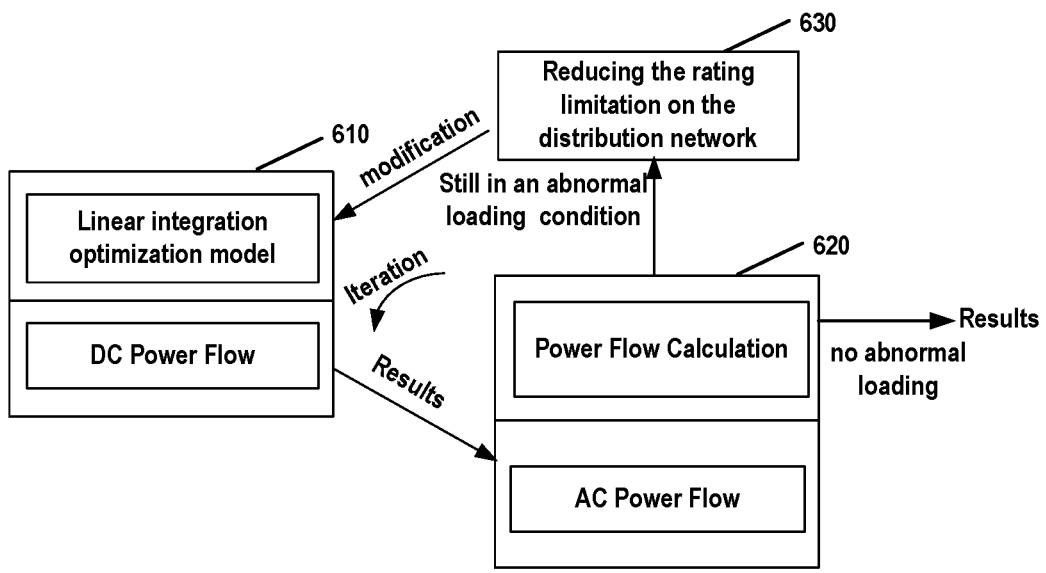
FIG. 6 schematically illustrates a diagram showing a reconfiguration optimization process according to an embodiment of the present disclosure.

FIG. 6 schematically illustrates a diagram showing the reconfiguration optimization process as proposed in the present disclosure. As illustrated, the optimization solving module 610 will solve the linear integration optimization model based on direct current (DC) power flow, that is to say, for the linear integration optimization model, the power flow constraint will be solved first based on DC power flow instead of AC power flow. The solving process may be performed by any suitable commercially available optimization software such as IBM ILOG. The results obtained by solving the integration optimization problem may be provided to an AC power flow simulation module 620, which will perform a power flow calculation based on AC power flow to check if the distribution network is still in an over loading condition. If the result of AC power flow calculation shows no over loading condition, then the solved result may be output as the final result. Otherwise, the constraint adjustment module 630 may adjust constrains of linear integration optimization model, especially reduce a rating limitation on the distribution network. After adjustment, the linear integration optimization may be solved again to obtain updated result. Therefore, in the reconfiguration optimization process, the power flow balance constraint will be solved first based on DC power flow, in such a way a nonlinear integration optimization model may be converted to a linear one. Then the result of the linear integration optimization model will be verified based on AC power flow calculation. Through iterations, it may find a practical global optimal solution.

Figure 7:
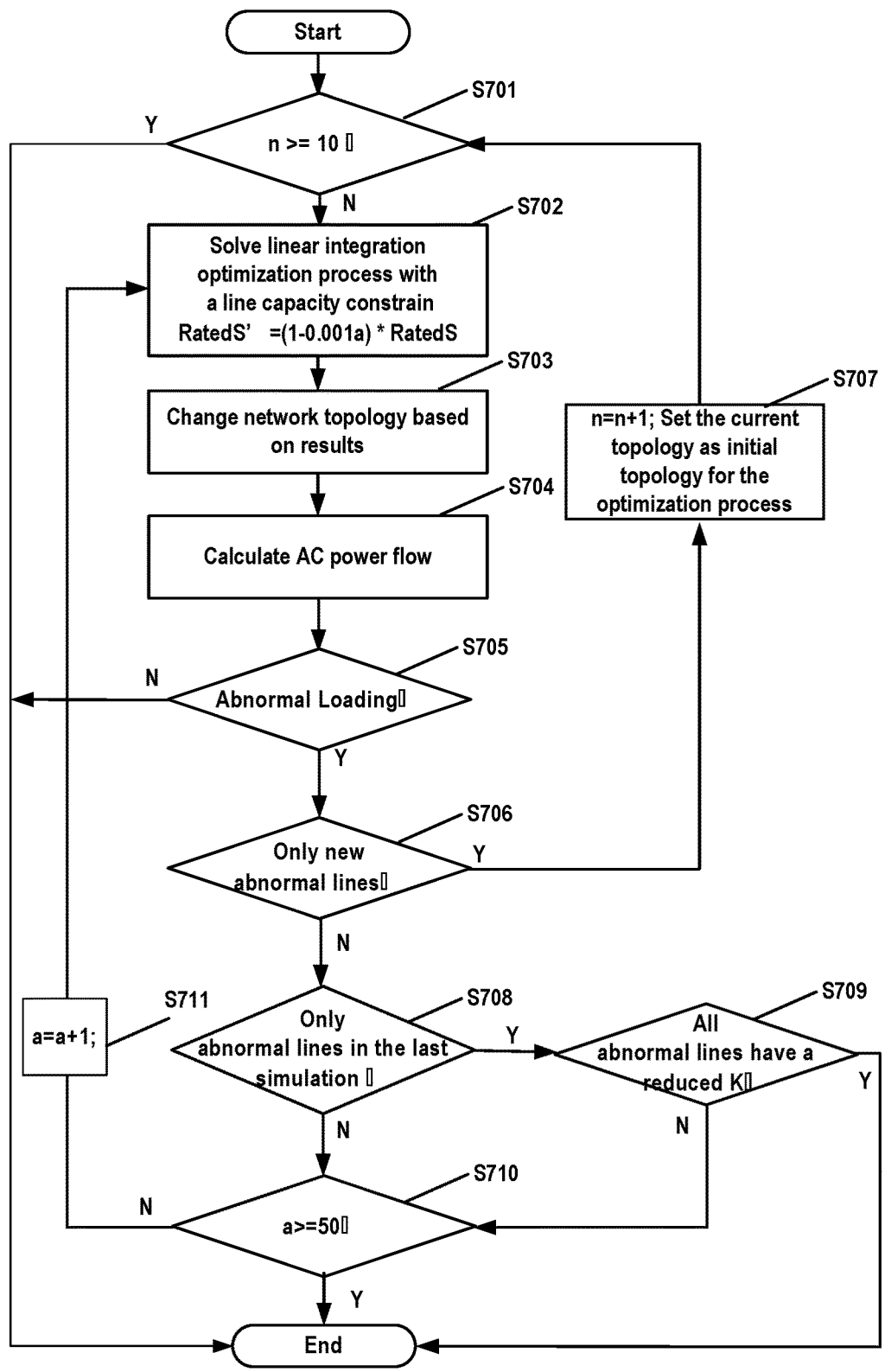
FIG. 7 schematically illustrates a flow chart of a method for performing a reconfiguration optimization process according to an embodiment of the present disclosure.

FIG. 7 schematically illustrates a flow chart of the reconfiguration optimization process according to an embodiment of the present disclosure. As illustrated in FIG. 7, at step S701, it may be first determined if a process trying number n is larger than the allowed maximum value, such as 10, and if so, the method ends. If not, then at step S702, it may solve the linear integration optimization model by means of optimization software such as IBM ILOG with a line capacity constraint ratedS'=(1−0.01a)*ratedS, wherein parameter a denotes the number of constraint adjustments and may have a initial value of 0. Then, switching operations may be performed based on the solution obtained from step S702 so as to change the network topology at step S703. Afterwards, at step S704, AC power flow will be recalculated based on the changed network topology. In accordance with the calculated power flow results, it may be determined whether there is an abnormal loading condition or not at step S705. If the abnormal loading condition has been eliminated, then the method may end. Otherwise, at step S706, it may be further determined if the abnormal line is a new line which is never in an abnormal loading condition in previous simulations. If there are only new abnormal lines, then at step S707, the process trying number n may be increased by 1, the current topology may be set as initial topology for the optimization process and then the method goes back to step S701. On the other hand, if the abnormal lines are not new lines, then it may determine at step S708 whether the abnormal lines are all the ones that occurs in the last simulation; if yes the method goes to step S710; if not, the method enters step S709.

At step S709, it may be determined whether new loading factors K of all the abnormal lines in the current topology are higher than respective loading factors K in the last simulation, i.e., whether the abnormal loading condition has alleviated or not. If yes, it may take the result as an output and the method ends, otherwise, the method goes to step S710. At step S710, it may determine whether the number of constraint adjustments a is above a threshold 50 or not. If so, then the method ends; if not, the method returns to step S711. At step S711, parameter a is increased by 1 for each abnormal line, and returns to step S702 and the method continues, As illustrated at step S502 in FIG. 5, even if there is a solution from the reconfiguration optimization process, it does not means that the solution should be taken as the final reconfiguration plan. Instead, it should be first determined whether the solution is an acceptable result. The acceptable result means that the result is a global optimization solution which satisfies the constraints and more importantly, it should also be feasible in practical operations. Thus, the solution should meet preset knowledge-based rules. The rules may include, for example the following rules:

Switches involved in the result should be switches that can be controlled automatically;

Switches involved in the result should not be switches that can not be operated due to reasons such as communication failure, out of service; and Any other suitable rules.

If the result is not a global optimal result or it fails to meet any one of the above-mentioned knowledge-based rules, then the DFS-BFS combined heuristic logic method will be performed.

The heuristic logic method is an algorithm different from the optimization algorithm and it may utilize a searching/discovery algorithm to simulate operational procedures as part of the heuristic process. The advantage of the heuristic logic method lies in that it allows use of some particular knowledge to cut down the number of alternatives to be evaluated to a manageable amount when solving the problems. The network reconfiguration problem is to decide the on/off status of the switches/breakers and thus the heuristic logic method based on binary decision tree may be used to solve the problem. The strategy of the searching determines calculation efficiency of the heuristic logic method. The searching algorithms such as DFS, BFS and best search can be adopted but in this present disclosure, there is proposed to utilize both DFS and BFS, or in other word, it combines DFS and BFS together in performing the heuristic logic method.

Figure 8:
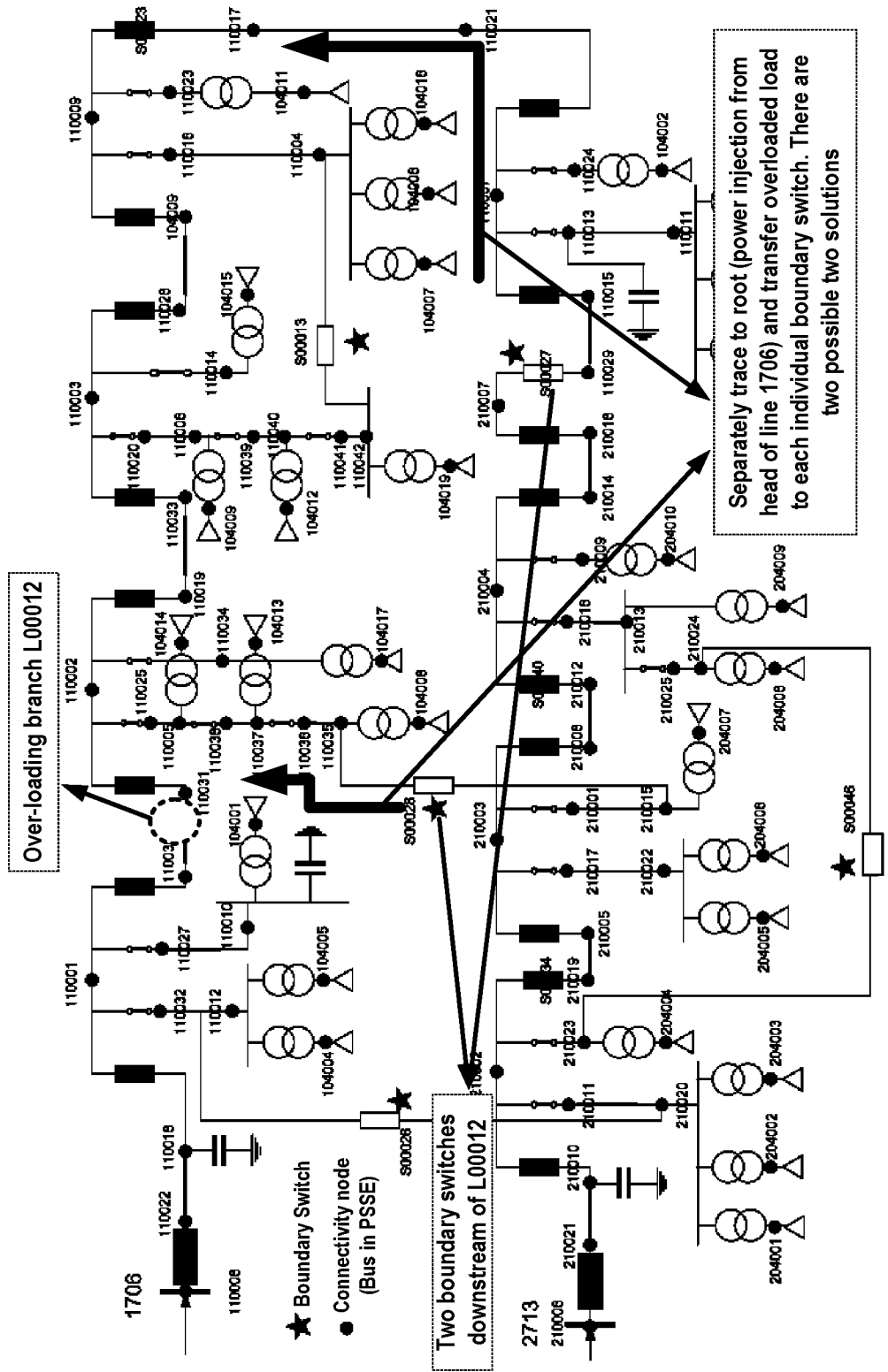
FIG. 8 schematically illustrates a diagram for a depth first trace searching (DFS) method.

The DFS is an algorithm for tracing, traversing or searching tree or graph data structures. The DFS starts at the root (in the graph case, a certain node may be selected as the root) and traces/explores as far as possible along each branch before backtracking. As illustrated in FIG. 8, in the DFS, all boundary switches (for example switches S00026 and S00027) located downstream of the abnormal branch (branch L00012) are firstly found. Then, the DFS starts from one of these boundary switches and traces upstream of the boundary switch along the feeder with the abnormal branch until a closed switch is found as a feasible switch to be opened to pair with this boundary switch, which can eliminate the overloading condition. After that, the tracing method backtrack to another boundary switch to find another feasible solution until all downstream boundary switches are traced. Accordingly, the DFS may provide a plurality of solutions. The details of this DFS will be described with reference to FIG. 11 and thus it will not be elaborated here.

The DFS method is advantageous in that it can provide minimum switching operation actions, in which only two switches are to be operated. However, it may be appreciated that the network reconfiguration might still cause an abnormal loading condition after a load is transferred from a feeder to another feeder, which will jeopardize the network reliability. Therefore, new index to evaluate this load transfer effects is proposed to overcome the disadvantage.

The proposed new index for the DFS may be called as Load Transfer Index (LTI), which indicates an impact on a load balance from a load transfer. The determination of LTI will be described hereinbelow.

First, it may be assumed that, for each feeder, there is a branch with a minimum margin capacity among all upstream branches of a boundary switch. The minimum margin capacity may be denoted by $I_{capM}^{min}$ and it may be can be calculated as:

$$I_{capM}^{min} = (I_{rated} - I_{real}^{BT}) \quad \text{(Equation 11)}$$

wherein $I_{capM}^{min}$ denotes a minimum branch capacity margin among upstream branches of a boundary switch; $I_{rated}$ denotes a rated capacity of a branch with the minimum branch capacity margin; and $I_{real}^{BT}$ denotes a real capacity of the branch with the minimum branch capacity margin before performing a load transfer or a network reconfiguration.

After performing the network reconfiguration, the capacity margin of the branch with the minimum branch capacity margin will be changed and the LTI for the network reconfiguration may be then calculated as:

$$LTI = [I_{capM}^{min} - (I_{rated} - I_{real}^{AT})]/I_{capM}^{min} * 100\% \quad \text{(Equation 12)}$$

wherein, parameters $I_{capM}^{min}$ and $I_{rated}$ are similar to those in equation 11; and $I_{real}^{AT}$ denotes a real capacity of the branch with the minimum branch capacity margin after performing the load transfer. By means of the index LTI, it may limit the abnormal loading condition caused by the solution from DFS.

Figure 9:
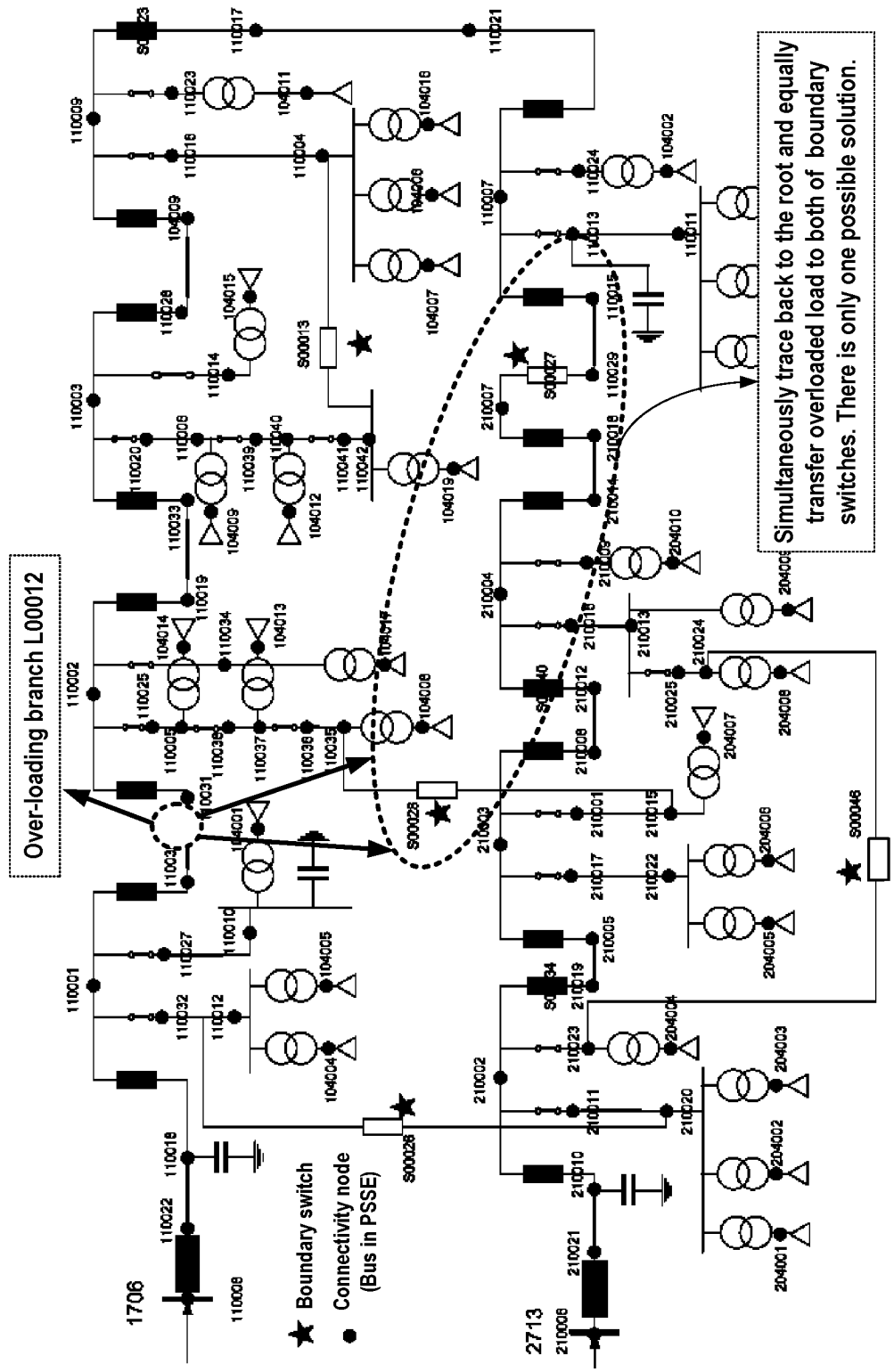
FIG. 9 schematically illustrates a diagram for a breadth first division searching (BFS) method.

As another searching algorithm in graphic theory, the BFS belongs to a blind division searching which will begin at a root node and inspect all the neighboring nodes and then, for each of the neighbor nodes, it inspects their neighbor nodes which were unvisited, and so on. As illustrated in FIG. 9, the BFS will start from all the boundary switches (for example switches S00026 and S00027) downstream of the overloaded branch (branch L00012) and almost equally transfers the overloaded load to all of their neighboring feeders via all boundary switches. Thus, it may provide only one solution by the BFS. For details about the BFS, please see the description made hereinafter wither reference to FIG. 12.

The advantage of the BFS lies in that it can provide a balanced load transfer plan but might require several switching operation actions when a plurality of possible boundary switches are involved. Therefore, for the BFS, there is further introduced a new index for switching operations in the present disclosure. That is to say, it may further set a maximum allowed number of switching operations in network reconfiguration. The maximum allowed number may be determined by a system operator or dispatcher for example based on practical operation experience. In the present disclosure, the number of switching operations in a distribution network reconfiguration may be denoted by Nr.

In the proposed heuristic method, both BFS and DFS algorithms are utilized to find feasible solutions and two above mentioned indices LTI and Nr are used to determine candidate solutions. Therefore, there are three types of solutions, which may be defined as follows:

Feasible solutions: solutions that meet the condition to relieve the abnormal loading situation but not are tested by the proposed indices;

Candidate solutions: a list of feasible solutions that satisfy respective predefined values for the proposed indices; and Final solution: one of candidate solutions, which may be a candidate solution on the top of the candidate solution list sorted t by LTI value or another index from the DFS, or a candidate solution from the BFS.

Next, reference will be made to FIGS. 10 to 12 to describe the DFS-BFS combined heuristic logic method as proposed in the present disclosure.

Figure 10:
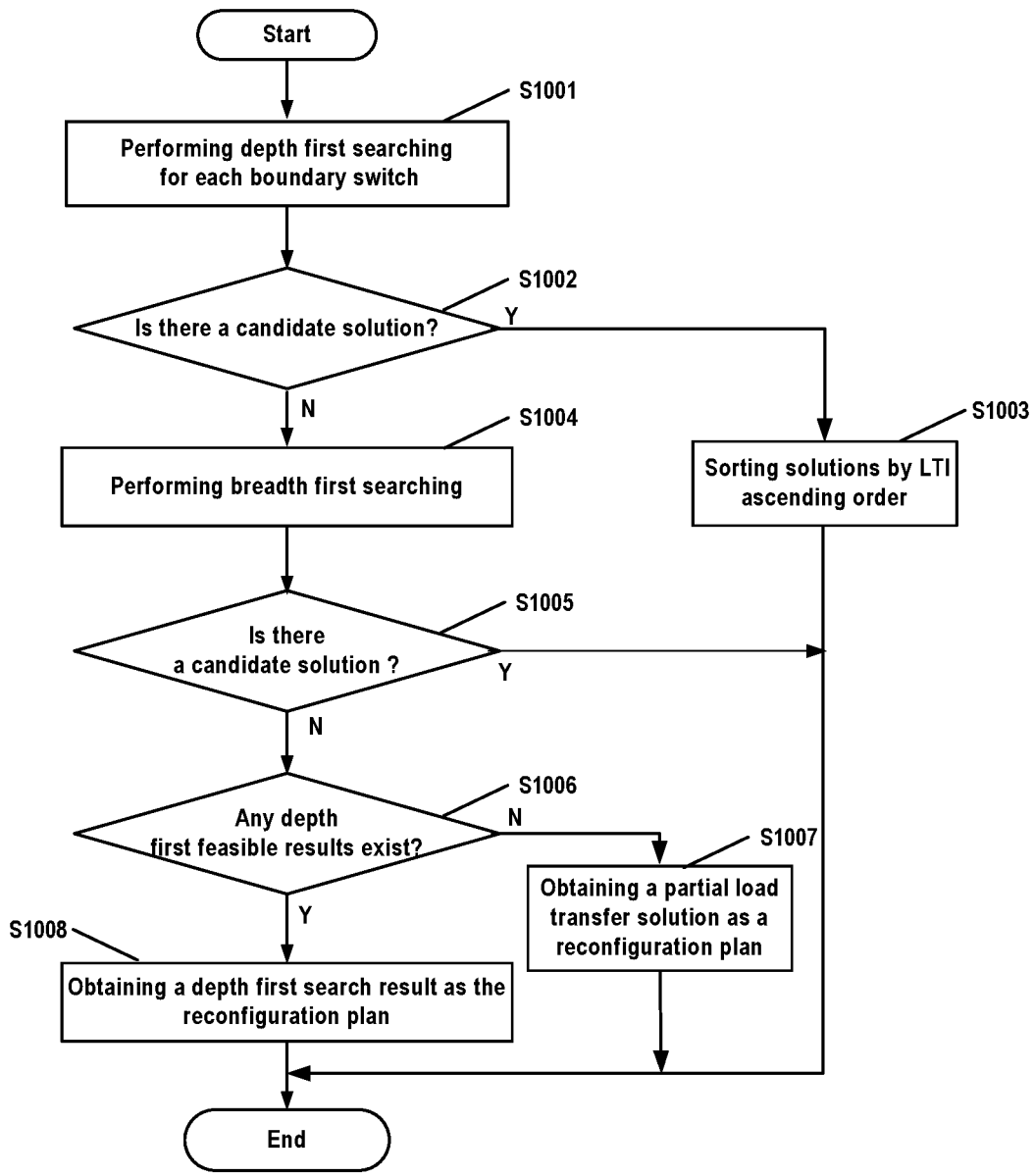
FIG. 10 schematically illustrates a flow chart of a method for performing a DFS-BFS combined heuristic logic method according to an embodiment of the present disclosure.

FIG. 10 schematically illustrates a flow chart of a method for performing a DFS-BFS combined heuristic logic method according to an example embodiment of the present disclosure. As illustrated in FIG. 10, at step S1001, the depth first trace searching may be first performed for each boundary switch so as to find all feasible solutions. Afterwards, at step S1002, it may be determined whether there is a candidate solution (i.e., a solution with an LTI within a predetermined range) among the feasible solutions found by the DFS algorithm. If there is at least one candidate solution, then the method goes to step S1003 at which the at least one candidate solution will be sorted or ranked by LTI, the impedance path between the abnormal branch and a boundary switch involved in the solution, or any other index, and then the method ends. On the other hand, if there is no any feasible solution or no candidate solution, then the method may proceed into step S1004.

At step S1004, the BFS will then be performed so as to obtain feasible solutions. Then, at step S1005, it may be determined whether there is a candidate solution, i.e., a solution with Nr within a predetermined range among the feasible solutions found by the BFS algorithm. If there is a candidate solution, then the method terminates. On the other hand, if there is no any feasible solution or no feasible solution having an Nr within the predetermined range, then the method may proceed into step S1006. At step S1006, it may check if there is any feasible solution from the DFS, i.e., a solution having a LTI beyond the predetermined range. If there is no such a solution, then the method goes to step S1007, at which a partial load transfer solution will be taken as the final solution. The partial load transfer solution may be based on performing either the depth first trace searching or the breadth first division searching, but it is not a feasible solution that either meet the predetermined condition. Moreover, preferably, it may select a partial load transfer solution that may cause a loading factor with a minimum value, i.e., may bring about a maximum mitigation of the abnormal loading condition.

On the other hand, if there is a feasible solution beyond the predetermined LTI range, then at step S1008, it may take the solution as the final solution. If there are multiple feasible solutions, it may take a solution with, for example, a minimum LTI or shortest impedance path as the final solution.

Next, the DFS and the BFS will be described respectively with reference to FIGS. 11 and 12.

Figure 11:
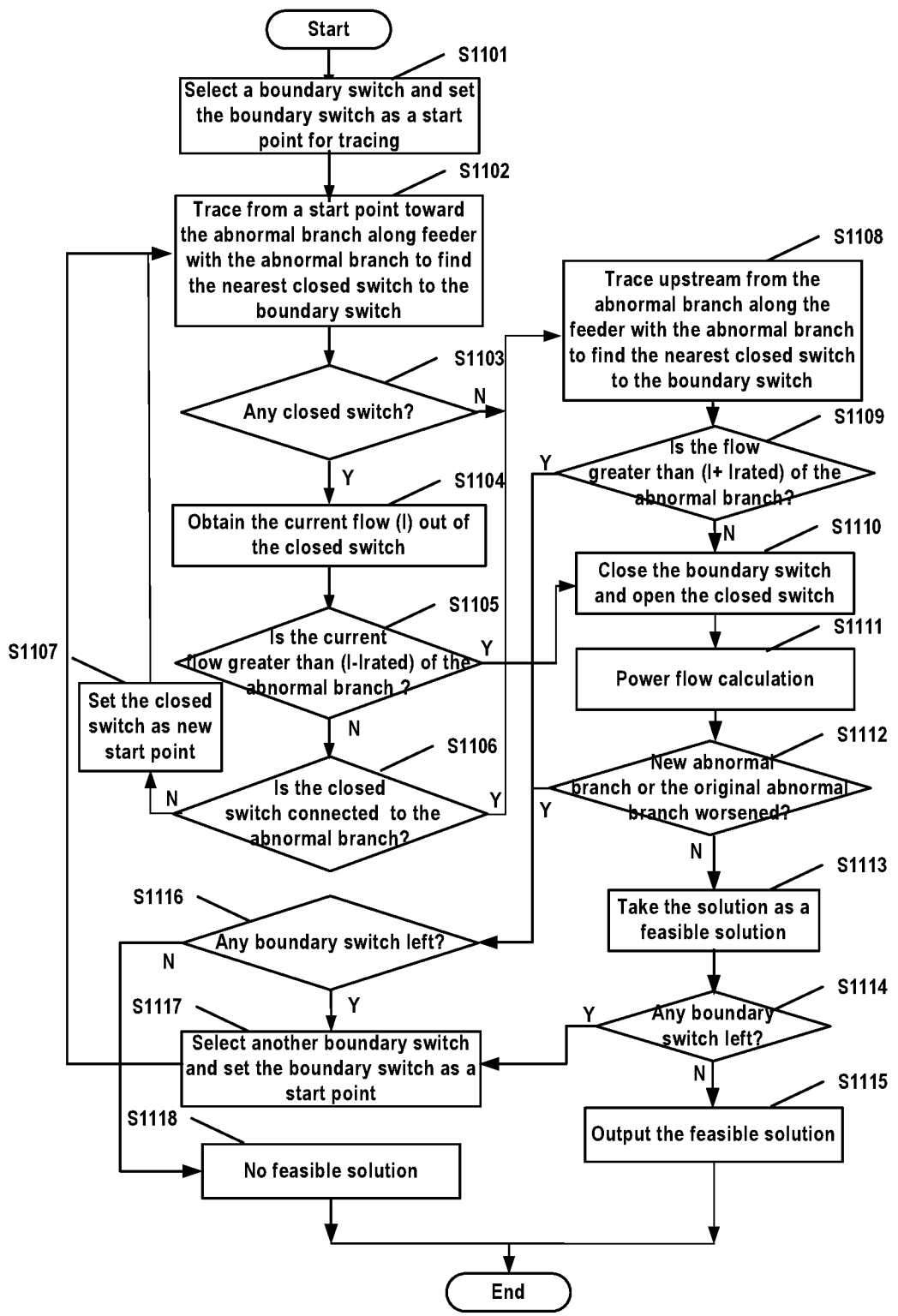
FIG. 11 schematically illustrates a flow chart of a method for performing a DFS method according to an embodiment of the present disclosure.

Reference is made to FIG. 11 which schematically illustrates a flow chart of a method for performing a DFS method according to an embodiment of the present disclosure. As illustrated, at step S1101, a boundary switch is selected from a set of boundary switches for the abnormal branch and set the selected boundary switch as a start point for tracing. Then as step S1102, it may trace from a start point (which is the selected boundary switch as present) toward the abnormal branch along a feeder with the abnormal branch, so as to find the nearest closed switches to the boundary switch. Afterwards, as step S1103, it may be determined if there is any closed switch. If not, the method proceeds into step S1108 to further trace in a different direction, otherwise the method goes to step S1104.

As step S1104, it may obtain the current flow out of the closed switch and then at step S1105, it may determine whether the flow is greater than the abnormal capacity, such as overloaded capacity (I−Irated), that is to say, determine whether the closed switch may address the abnormal condition. If yes, the method proceeds into step S1110, otherwise, the method goes to step S1106. As step S1106, it may be determined that whether the closed switch is connected to the abnormal branch, i.e., whether the closed switch is the last closed switch from the selected boundary switch to the abnormal branch or whether the tracing in this direct is finished. If it is, then the method proceeds to step S1108 to further trace in a different direction; if no, the method goes to step S1107, at which the closed switch is set as a new start point and then at step S1101, the tracing continues from the new start point.

At step S1108, it will trace upstream from the abnormal branch along the feeder with the abnormal branch to find the nearest closed switch to the boundary switch. If there is a closed switch and the current flow out of the closed switch is lower than (I+ rated) of abnormal branch (whether the found switch may address the abnormal loading condition) at step S1109, the method goes to step S1110, otherwise the method goes to step S1116 to determine if there is any other boundary switch for which the DFS is not performed. If yes, the method goes to S1117 at which another boundary switch is selected and the selected boundary switch is set as a new start point for tracing, then the method skips back to step S1101 to perform a tracing for the new selected boundary switch. On the other hand, if it determines that there is no boundary switch left, the method goes to step S1118 and gives a result indicating there is no feasible solution and then the method terminates.

If the found switch may address the abnormal condition, then at step S1110, it may close the boundary switch and open the closed switch, and then detect if there is still any abnormal loading condition by performing a power flow calculation at step S1111. Based on results of the power flow calculation, it may determine whether there is a new abnormal branch or the original abnormal branch is worsened. If yes, then the method goes to step S1116 to determine where there is any other boundary switch left, otherwise at step S1113, the solution from step S1108 or S1102 may be taken as a feasible solution for the original abnormal loading condition. Then the method proceed to step S1114, at which it may continue to determine where there is any bound switch for which tracing may be performed. If yes, the method proceeds to step S1117 to select a new boundary switch and set the start point for the new tracing; if no, the method will proceed to step S1115 to output the feasible solution and the method ends.

As mentioned hereinabove, if there is a feasible solution with a LTI within a predetermined LTI range, i.e., not higher than a predetermined threshold, the feasible solution will be taken as a candidate solution. If there are multiple candidate solutions, then they may be sorted or ranked by LTI or other indexes. On the other hand, if there is no feasible solution with a LTI within the predetermined LTI range, then the BFS may be further performed. Next the BFS will be described with reference to FIG. 12, which schematically illustrates a flow chart of a method for performing a BFS method according to an example embodiment of the present disclosure.

Figure 12:
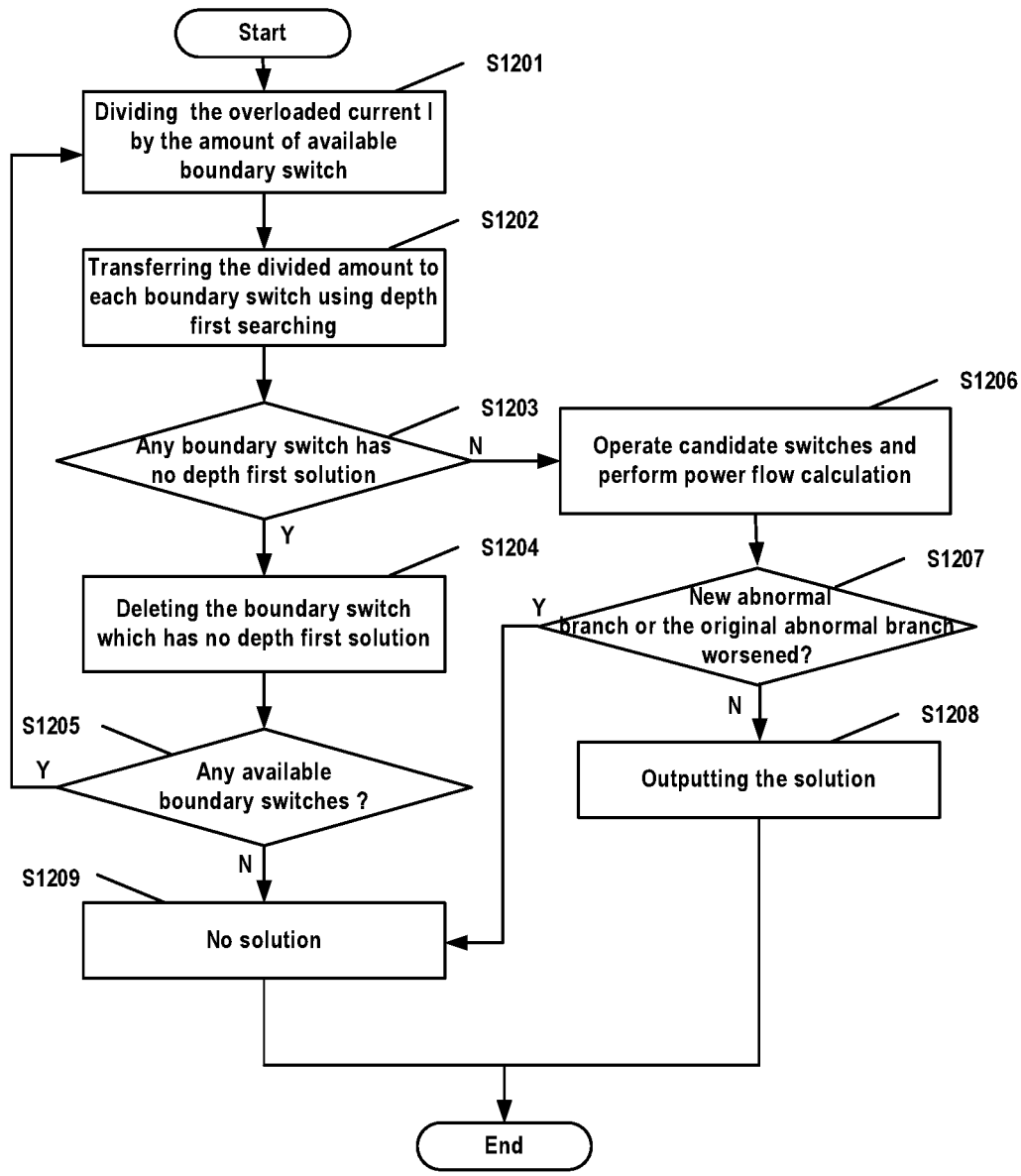
FIG. 12 schematically illustrates a flow chart of a method for performing a BFS method according to an embodiment of the present disclosure.

As illustrated in FIG. 12, first at step S1201, the abnormal capacity such as the overloaded current I may be divided by the total amount of available boundary switches M. As described hereinabove, for the BFS, the abnormal load will be transferred to all of their neighboring feeders via all the boundary switches, and thus, the overloaded current should be divided into M parts, each part will be injected into a boundary switch. The injection of each part may be performed based on the DFS to search a feasible solution for each boundary switch. If there is one or more boundary switch having no feasible solutions from the DFS, then at step S1204, the one or more boundary switch having no feasible solutions will be deleted from the available boundary switches and the total amount of available boundary switches M will be decreased by the number of deleted boundary switches. Then at step S1205, if it determines if there is any available boundary switches or whether all boundary switches have been deleted, i.e., if the value of M is higher than 0. If M is higher than 0, then the methods skip back to step S1201 and operations will be repeated with reduced number of available boundary switch. If there is no any boundary switch left, then at step S1209, it may give a result so as to indicate there is no feasible solution.

If there is no any boundary switch without a feasible DFS solution, then the method goes to step S1206 at which the candidate switches involved in each DFS solution will be operated and then a power flow calculation will be performed. After that, at step S1207, it may be determined based on the result of the power flow calculation if there is a new abnormal branch or the original abnormal branch is worsened. If yes, then it may proceed to S1209 at which it determines that there is no solution; if no, then the solution will be output as a feasible solution for the BFS at step S1208.

From the above description of the DFS and the BFS, it may consider that the BFS comprises a plurality of DFS and thus it will take more time than the DFS. That is the reason why the DFS is performed first and only if the DFS fails to find a candidate solution, the BFS is performed. However, it may be appreciated that, it may also first perform the BFS instead, and the DFS is performed when there is no solution although it may not be preferable.

Besides, in the present disclosure, a reconfiguration analysis process which performs a reconfiguration optimization process first and then performs the heuristic logic method is described. However, it may be understand that, the heuristic logic method may also performed before the reconfiguration optimization process, or only one of the heuristic logic method and the reconfiguration optimization process is performed as the reconfiguration analysis process.

Hereinbefore, description has been made through taking the over loading as an example of the abnormal loading, however it may be understood that the abnormal loading could be heavy loading as well.

Figure 13A:
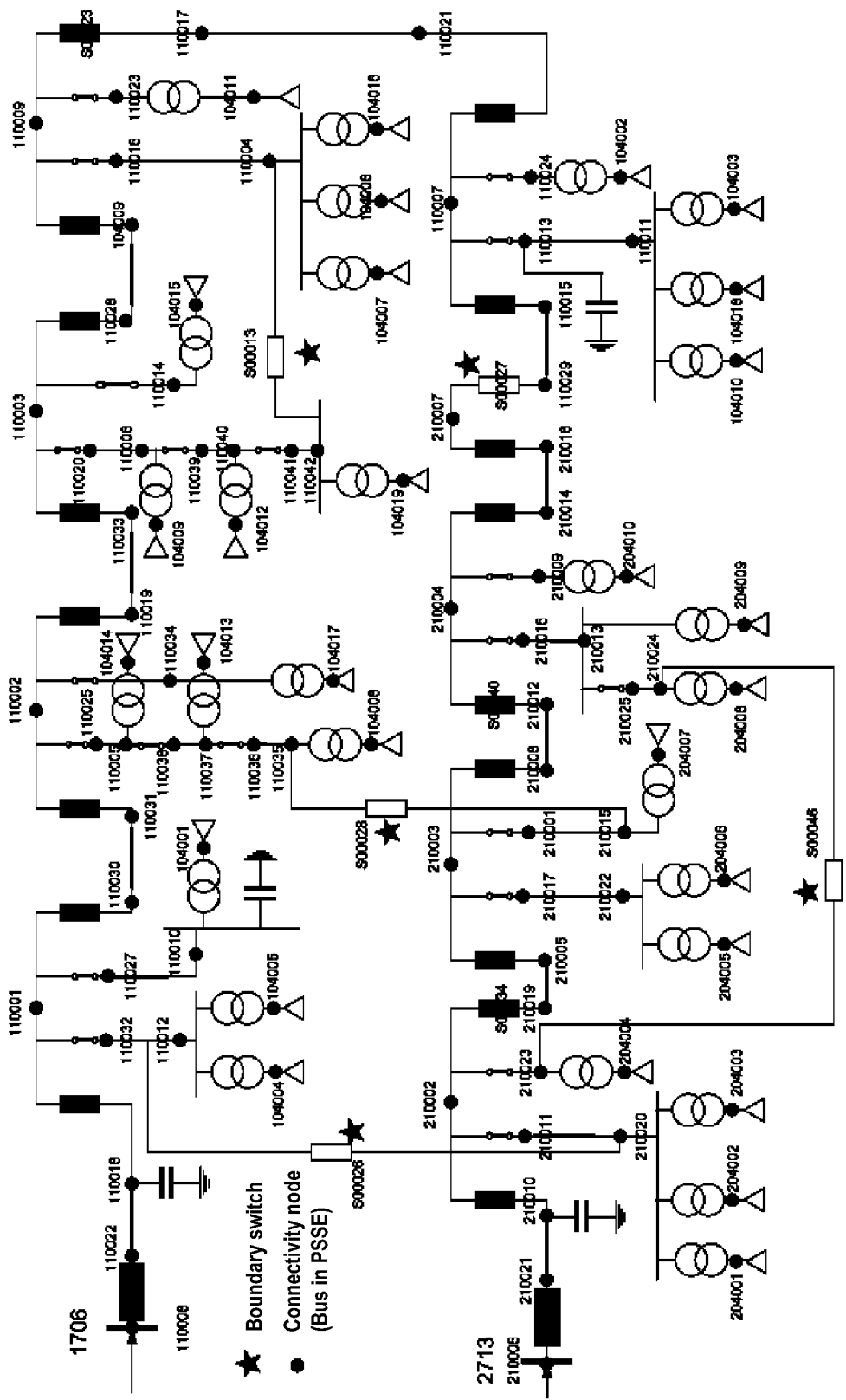
FIG. 13A schematically illustrates a single line diagram of a two-feeder testing system on which simulations for the reconfiguration optimization process are performed.

To test the method as proposed in the present disclosure, simulations have been performed on two example testing systems. Regarding the reconfiguration optimization process, the testing system is a small-type distribution network system with two feeders and 96 nodes, which has been illustrated in FIG. 13A. As illustrated in FIG. 13A, the two feeders 1706, 2713 are connected via boundary switches S00026, S00027, S00028 and the two feeders 1706, 2713 also have boundary switches S00013, S00046 respectively located between their respective branches. The two main lines have a maximum line capacity of 10.18 MVA and 9.18 MVA respectively, the branches has a line capacity of 4 MVA and 5.38 MVA respectively and each distribution transformer is connected to a load and has a maximum capacity ranging from 0.62 MVA to 4 WA. The load data for feeders 1706 and 2713 are 10.133 MW and 2.977 MW, respectively. The AC power flow calculation is performed through PSS@E. The initial overloaded segments and the calculated power flow are given in table 1.

TABLE 1

| | Original overloaded line power flow | | | | | | |
|---|---|---|---|---|---|---|---|
| Line | From-bus | To-bus | P(MW) | Q(MVAR) | S (MVA) | Rate (MVA) | K(%) |
| L00012 | 110030 | 110031 | 10.5684 | 3.7438 | 11.2119 | 9.1800 | 122.1340 |
| L00009 | 110018 | 110022 | 11.8971 | 5.0060 | 12.9074 | 10.1800 | 126.7915 |

Table 2 illustrates the solution obtained through solving the linear integration optimization problem without any iteration, which is performed by IBM ILOG and takes about one second by means of a common personal computer.

TABLE 2

| Solution from the linear integration optimization problem | | | | |
|---|---|---|---|---|
| Switches | From-bus | To-bus | Before | After |
| S00014 | 110005 | 110038 | 1 | 0 |
| S00028 | 110035 | 210015 | 0 | 1 |

However, the AC simulation on the solution gives results as illustrated in table 3.

TABLE 3

| AC current simulation results on solution as illustrated in Table 2 | | | | | | | |
|---|---|---|---|---|---|---|---|
| Line | From-bus | To-bus | P(MW) | Q(MVAR) | S (MVA) | Rate (MVA) | K(%) |
| L00012 | 110030 | 110031 | 9.9200 | 3.5008 | 10.5196 | 9.1800 | 114.5927 |
| L00009 | 110018 | 110022 | 11.1876 | 4.6378 | 12.1108 | 10.1800 | 118.9664 |

It is clear that the solution as illustrated in table 3 is to transfer part of the load to other branch so as to eliminate the overloading condition. However, Table 3 shows the initial overloaded lines are still in the abnormal loading conditions.

Table 4 illustrates the solution obtained through iterations based on AC power flow results, wherein n=0 and a=1.

TABLE 4

| Refined solutions from the linear integration optimization problem | | | | |
|---|---|---|---|---|
| Switches | From-bus | To-bus | Before | After |
| S00018 | 110007 | 110021 | 1.0000 | 0 |
| S00027 | 110029 | 210007 | 0.0000 | 1 |

Results of AC simulation on the solution given in table 4 are illustrated in table 5.

TABLE 5

AC current simulation results on solution as illustrated in Table 4

| Line | From-bus | To-bus | P (MW) | Q (MVAR) | S (MVA) |
|---|---|---|---|---|---|
| L00012 | 110030 | 110031 | 7.1320 | 9.1800 | 88.0948 |
| L00009 | 110018 | 110022 | 7.9410 | 10.1800 | 91.8424 |

From tables 4 and 5, it may be seen that the solution is to transfer all load of a segment switch to the adjacent feeder. Thus, it may be seen that the loading factor is reduced greatly and the abnormal loading condition is alleviate considerately. Thus, it may provide a practical solution at a high efficiency and the solution may be trusted and used.

Figure 13B:
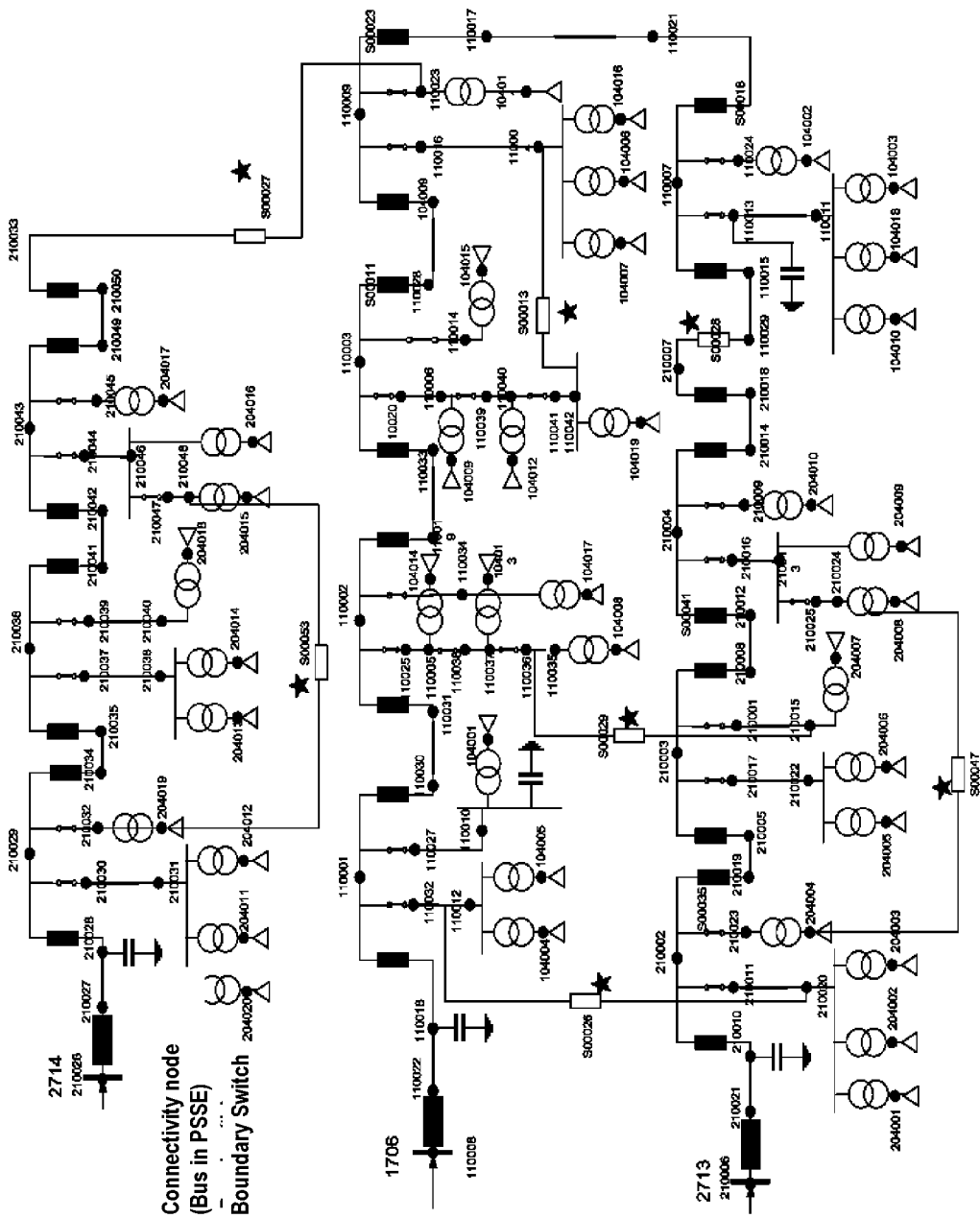
FIG. 13B schematically illustrates a single line diagram of a three-feeder testing system on which simulations for the heuristic logic method combing both the DFS and the BFS are performed.

FIG. 13B illustrates another testing system for the DFS-BFS combined heuristic method as proposed in the present disclosure. The testing system is a three-feeder distribution network system with 131 buses. This testing system is utilized instead of standard IEEE testing systems because of the complexity of the logical process of this combined heuristic method. As illustrated, there are three feeders 1706, 2713 and 2714, and the load data for feeder 1706, 2713 and 2714 are 10.808 MW, 3.617 MW and 2.519 MW, respectively. In addition, there are three types of branch with the rated capacity of 3.98 MVA, 5.37 MVA and 9.18 MVA, respectively. Feeder 1706 is connected to feeder 2713 via tie switches S00026, S00028 and S00029 and feeder 1706 is also connected to feeder 2714 via tie switch S00027. Besides, the first bus of each feeder is deemed as a swing bus to balance the load and demand and the system is assumed to be three phase balanced during simulation. In addition, the predefined threshold for LTI and Nr is set as 50% and 4, respectively.

In the following, two scenarios will be investigated wherein one is the case with a complete load transfer solution and another is the case with a partial load transfer solution. The entire process is simulated in a case study, and the entire programming is implemented by using Python language considering and the power flow calculation tool is PSS@E.

Scenario I: Complete Load Transfer Solution

In this case, the original overloaded segments and the calculated power flow are given as follows.

TABLE 6

Original overloaded branch

| Branch | From-bus | To-bus | I (A) | Irated (A) | K (%) |
|---|---|---|---|---|---|
| L00012 | 110030 | 110031 | 728.248 | 530.008 | 137.40 |

First, a DFS algorithm is performed and a feasible solution is found DFS feasible solution which is given as follows:

TABLE 7

Feasible DFS solution

| Switches | From-bus | To-bus | Before | After | Branch_K after (%) |
|---|---|---|---|---|---|
| S00027 | 110023 | 210033 | 0 | 1 | 52.62 |
| S00025 | 110009 | 110026 | 1 | 0 | |

The calculated LTI value of the feasible DFS is given in table 8.

TABLE 8

LTI value of the DFS solution

| Min margin branch | From-bus | To-bus | I minM (A) | I rated (A) | I after (A) | LTI |
|---|---|---|---|---|---|---|
| L00026 | 210028 | 210027 | 485.404 | 531.740 | 449.170 | 82.99% |

Table 8 shows that the DFS solution will cause a heavy load on branch L00026 with LTI 82.99% which is greater than the predefined value 50%. Therefore, the BFS algorithm will be utilized to continually find another solution and the candidate solution is given in table 9.

In the table 9, there is listed a candidate solution, according to which, the load will be transferred to feeders 2714 and 2713 simultaneously via boundary switches S00027 and S00029, respectively.

TABLE 9

Feasible BFS Solutions

| Switches | From-bus | To-bus | Before | After | LTI (%) | k_after (%) |
|---|---|---|---|---|---|---|
| S00027 | 110023 | 210033 | 0 | 1 | 10.86 | 97.61 |
| S00024 | 110023 | 110009 | 1 | 0 | | |
| S00029 | 110035 | 210015 | 0 | 1 | 44.42 | |
| S00006 | 110025 | 110002 | 1 | 0 | | |

Scenario II: Partial load transfer solution

Generally, it is highly possible that there is not any DFS or BFS solution to eliminate the overloading situation. In such a case, a partial load transfer solution which can maximally relieve the overloading condition may be considered.

If the overloading rate of Branch L00012 is increased from 137.4% to 158%, feeder 2714 can only provide a partial load transfer solution to feeder 1706 via boundary switch S00028. The simulation result is displayed in table 10.

TABLE 10

Partial load transfer solution

| Switches | From-bus | To-bus | Before | After | k_after |
|---|---|---|---|---|---|
| S00028 | 110029 | 210007 | 0 | 1 | 105.109% |
| S00023 | 110017 | 110009 | 1 | 0 | |

Accordingly, The real-time data from, for example, the AMI may provide more accurate load data which is close to real-time load data and enable the power flow calculation of a distribution network to be trusted and used by the system operators. Based on the new information provided by the AMI and the data provided by the existing distribution SCADA system, system operators shall have much more comprehensive awareness of the real-time distribution network operating conditions, especially the identification of the locations and the degree of the line and equipment overload conditions. Consequently, a network reconfiguration solution can be implemented based on the real-time or quasi real-time network overloading conditions.

In the present disclosure, there is proposed the combined heuristic logic network reconfiguration process, which may fully take the advantages of both DFS and BFS, and uses two indices, the number of Switching Operations, Nr, and the Load Transfer Index (LTI) to develop a set of heuristic rules to achieve the reliable and operation practical reconfiguration solution with the multiple objectives of balanced load transfer with minimum switch operations. The case simulation demonstrates the feasibility of the proposed method, and the simulation results also indicate that the more complicated configuration the system has, the more practical solution this method would provide.

Besides, before performing the combined heuristic logic network reconfiguration process, it may first perform a refined linear integration reconfiguration optimization process in which the obtained solution will be verified and refined based on AC power simulation.

Accordingly, with embodiments of the present disclosure, it may obtain a more practical and accurate reconfiguration plan which can be trusted and used by system operators. Thus, the power grid may operate with improved stability and reliability at a reduced cost and a high efficiency.

Figure 14:
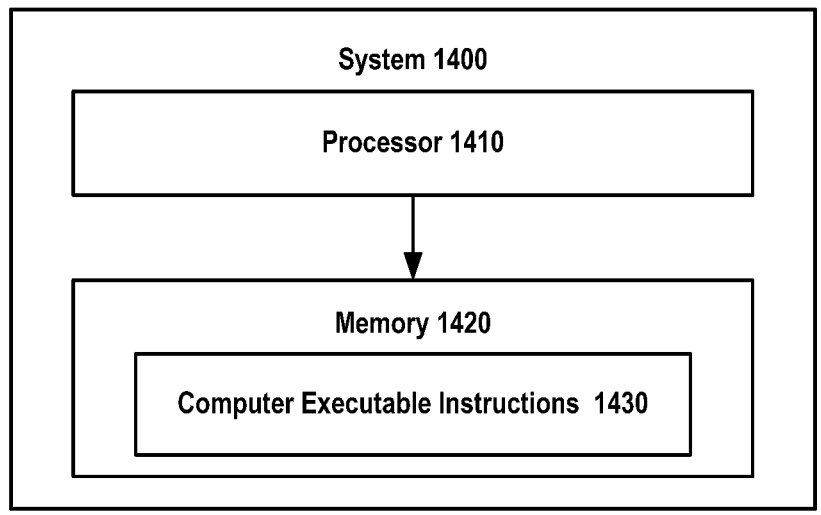
FIG. 14 schematically illustrates a block diagram of a system for distribution network reconfiguration according to an embodiment of the present disclosure.

Additionally, in embodiments of the present disclosure, there is also provided a system for distribution network reconfiguration, which will be described with reference to FIG. 14. As illustrated in FIG. 14, the system 1400 may include circuitry comprising at least one processor 1410 and at least one memory 1420 storing computer executable instructions 1430. The at least one memory 1410 and the computer executable instructions 1430 may be configured to, with the at least one processor 1420, cause the system 1400 to: detect an abnormal loading condition in a distribution network based on real-time measurements on the distribution network; and perform, in response to the detected abnormal loading condition resulted from excessive real power, a reconfiguration analysis process on the distribution network to obtain a reconfiguration plan for the detected abnormal loading condition. The reconfiguration analysis process is performed based on a heuristic logic method combining both depth first trace and breadth first division.

In an embodiment of the present disclosure, a load transfer index that indicates an impact on a load balance from a load transfer and the number of switching operations during a load transfer may determine a manner in which the depth first trace and the breadth first division are combined.

In another embodiment of the present disclosure, a result obtained by performing the depth first trace searching may be taken as the reconfiguration plan if the result has a load transfer index lower than a predetermined index threshold.

In a further embodiment of the present disclosure, a result with the lowest load transfer index or a result with the shortest impedance path between a branch in the detected abnormal loading condition and a boundary switch involved in the result may be taken as the reconfiguration plan.

In a still further embodiment of the present disclosure, the breadth first division searching may be performed in response to failing to obtain, by performing the depth first searching, a result with a load transfer index lower than a predetermined index threshold.

In a yet further embodiment of the present disclosure, a result obtained by performing the breadth first division searching may be taken as the reconfiguration plan if the result has the number of switching operations lower than a predetermined number threshold.

In a still yet further embodiment of the present disclosure, a result obtained by performing the depth first trace searching with a lowest load transfer index beyond a predetermined index threshold may be taken as the reconfiguration plan if each of results obtained by performing the breadth first division searching have the number of switching operations beyond a predetermined number threshold.

In another further embodiment of the present disclosure, the load transfer index may be determined by $$LTI = [I_{capM}^{min} - (I_{rated} - I_{real}^{AT})]/I_{capM}^{min} * 100\%$$

wherein LTI denotes the load transfer index; $I_{capM}^{min}$ denotes a minimum branch capacity margin among upstream branches of a boundary switch; $I_{rated}$ denotes a rated capacity of a branch with the minimum branch capacity margin; and $I_{real}^{AT}$ denotes a real capacity of the branch with the minimum branch capacity margin after performing a load transfer.

In a further embodiment of the present disclosure, wherein a partial load transfer plan, obtained based on performing either the depth first trace searching or the breadth first division searching, may be taken as the reconfiguration plan, if both the breadth first searching and the depth first searching fail to find any results.

In a still further embodiment of the present disclosure, the partial load transfer plan may be a plan that could cause a loading factor with a minimum value.

In a yet further embodiment of the present disclosure, the heuristic logic method may be performed when a reconfiguration optimization process based on direct current power flow fails to obtain an acceptable reconfiguration plan, wherein the reconfiguration optimization process based on power flow has an objective of minimizing the number of switching operations and has one or more of a network topology constraint, a power flow balance constraint, a switching times constraint and a line capacity constraint.

In a still yet further embodiment of the present disclosure, the reconfiguration optimization process based on direct current power flow may refine its result by performing iteration operations under a rating limitation on the distribution network that is adjusted based on an alternate current power flow simulation result.

In another further embodiment of the present disclosure, the reconfiguration optimization process based on direct current power flow may be determined as failing to obtain an acceptable reconfiguration plan, in response to any one of: no global optimal results being obtained; and none of results meeting knowledge based rules.

In a further embodiment of the present disclosure, the detecting an abnormal loading condition in a distribution network may comprise: calculating power flow based on the real-time measurements on the distribution network; and determining, based on the calculated power flow, a loading factor indicating a loading condition.

In a still further embodiment of the present disclosure, the abnormal loading condition may be detected when the loading factor is higher than a predetermined factor threshold.

In a yet further embodiment of the present disclosure, the loading factor may be determined by $$K = \frac{\sqrt{p^2 + q^2}}{S_r}$$

wherein K denotes the loading factor; p denotes active power of each equipment in the distribution network; q denotes reactive power of each equipment in the distribution network; and $S_r$ denotes rated apparent power of each equipment in the distribution network.

In a still yet further embodiment of the present disclosure, the detected abnormal loading condition resulted from excessive real power may be determined when a power factor under the detected abnormal loading condition is higher than a predetermined benchmark power factor threshold.

In another further embodiment of the present disclosure, wherein the abnormal loading condition may comprise an overloading condition or a heavy loading condition.

In a further embodiment of the present disclosure, wherein the real-time measurements on a distribution network are real time data measured by Advanced Metering Infrastructure (AMI).

In a still further embodiment of the present disclosure, the system may be further configured to perform a reconfiguration on the distribution network based on the reconfiguration plan.

Figure 15:
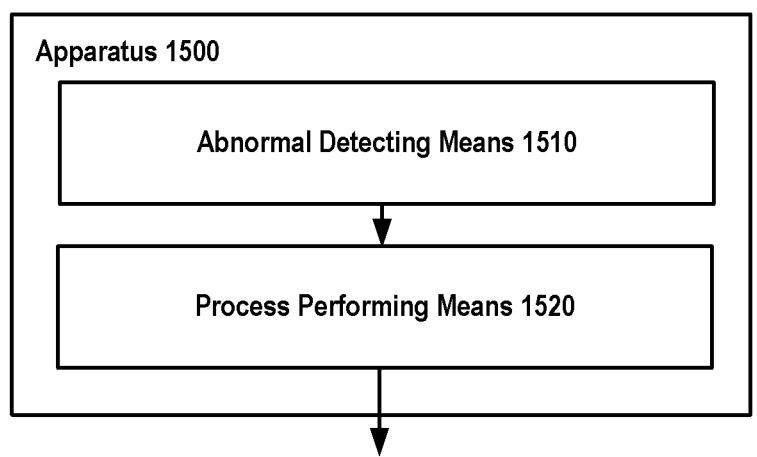
FIG. 15 schematically illustrates a block diagram of an apparatus for distribution network reconfiguration according to an embodiment of the present disclosure.

Besides, there is also provided an apparatus for distribution network reconfiguration which will be described with reference to FIG. 15. As illustrated in FIG. 15, the apparatus 1500 may comprise: means 1510 for detecting an abnormal loading condition in a distribution network based on real-time measurements on the distribution network; and means 1520 for performing, in response to the detected abnormal loading condition resulted from excessive real power, a reconfiguration analysis process on the distribution network to obtain a reconfiguration plan for the detected abnormal loading condition. Especially, the means 1520 for performing is configured to perform the reconfiguration analysis process based on a heuristic logic method combining both depth first searching and breadth first searching.

Figure 16:
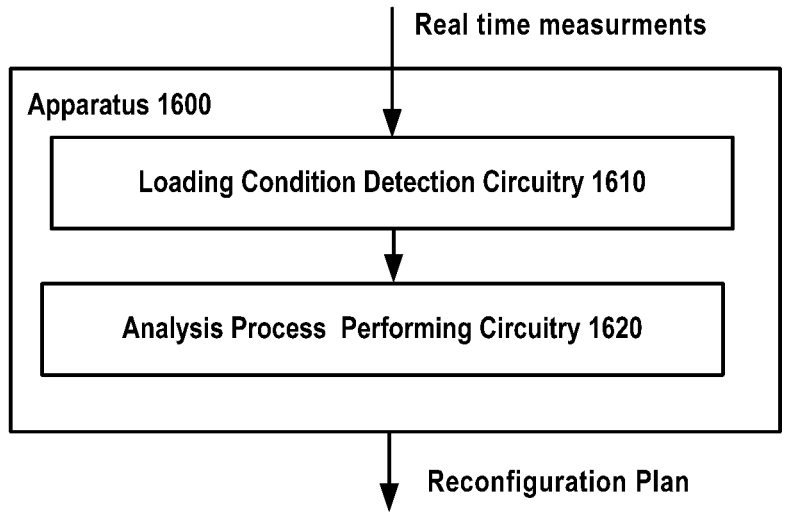
FIG. 16 schematically illustrates a block diagram of an apparatus for distribution network reconfiguration according to another embodiment of the present disclosure.

In addition, there is further provided an apparatus for distribution network reconfiguration. FIG. 16 schematically illustrates a block diagram of an apparatus for distribution network reconfiguration according to an embodiment of the present disclosure. The apparatus 1600 may comprise a loading condition detection circuitry 1610 configured to detect an abnormal loading condition in a distribution network based on real-time measurements on the distribution network; and an analysis process performing circuitry 1620 configured to perform, in response to the detected abnormal loading condition resulted from excessive real power, a reconfiguration analysis process on the distribution network to obtain a reconfiguration plan for the detected abnormal loading condition. Particularly, the analysis process performing circuitry 1620 may be configured to perform the reconfiguration analysis process based on a heuristic logic method combining both depth first searching and breadth first searching.

Furthermore, there is provided a tangible computer-readable medium having a plurality of instructions executable by a processor circuitry to manage loads of a power grid, the tangible computer-readable medium may comprise instructions configured to perform steps of the method according to any embodiments of method of the present disclosure.

It should be noted that operations of respective models or means as comprised in the system 1400, apparatus 1500, and apparatus 1600 substantially correspond to respective method steps as previously described. Therefore, for detailed operations of respective models or means in the system 1400, apparatus 1500, apparatus 1600, please refer to the previous descriptions of the methods of the present disclosure with reference to FIGS. 1 to 13.

Figure 17:
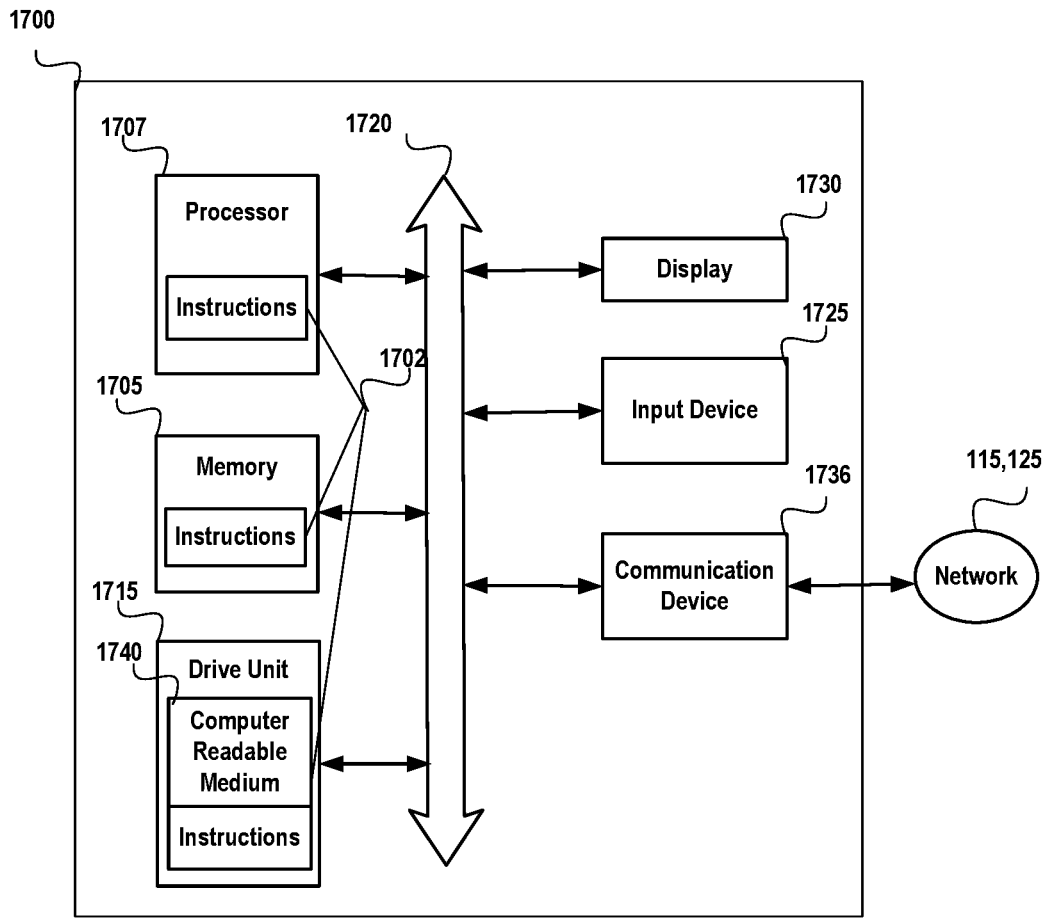
FIG. 17 schematically illustrates schematically illustrates a general computer system, programmable to be a specific computer system, which may represent any of the computing devices referenced herein.

FIG. 17 is circuitry of a computer system 1700, which may represent any of the computing devices referenced herein. For instance, the circuitry of the computer system 1700 may represent—in part or in its entirety—the control center, the head end, the integrated network operations and management system (NOMS), the fault, performance, and configuration management (FPCM) module, or any other computing devices referenced herein such as the end devices, the meters, the telemetry interface units (TIUs), the collectors, and/or any networked components such as routers, switches or servers as discussed herein. The computer system 1700 may include an ordered listing of a set of instructions 1702 that may be executed by circuitry to cause the computer system 1700 to perform any one or more of the methods or computer-based functions disclosed herein. The circuitry of the computer system 1700 may operate as a stand-alone device(s) or may be connected, e.g., using the network 115, 125, to other computer systems or peripheral devices.

In a networked deployment, circuitry of the computer system 1700 may operate in the capacity of a server or as a client-user computer in a server-client user network environment, or as a peer computer system in a peer-to-peer (or distributed) network environment. The computer system 1700 may also be circuitry implemented as or incorporated into various devices, such as a personal computer or a mobile computing device capable of executing a set of instructions 1702 that specify actions to be taken by that machine, including and not limited to, accessing the network 115, 125 through any form of browser. Further, each of the systems described may include any collection of sub-systems that individually or jointly execute a set, or multiple sets, of instructions to perform one or more computer functions.

The circuitry of the computer system 1700 may include a processor 1707, such as a central processing unit (CPU) and/or a graphics processing unit (GPU). The circuitry of the processor 1707 may include one or more general processors, digital signal processors, application specific integrated circuits, field programmable gate arrays, digital circuits, optical circuits, analog circuits, combinations thereof, or other now known or later-developed devices for analyzing and processing data. The processor 1707 may implement the set of instructions 1702 or other software program, such as manually-programmed or computer-generated code for implementing logical functions. The logical function or any system element described may, among other functions, include circuitry to process and/or convert an analog data source such as an analog electrical, audio, or video signal, or a combination thereof, to a digital data source for audio-visual purposes or other digital processing purposes such as for compatibility with computer processing or networked communication.

The circuitry of the computer system 1700 may include a memory 1705 on a bus 1720 for communicating information. Code operable to cause the circuitry of the computer system to perform any of the acts or operations described herein may be stored in the memory 1705. The memory 1705 may be a random-access memory, read-only memory, programmable memory, hard disk drive or any other type of volatile or non-volatile memory or storage device.

The computer system 1700 may also include a disk, solid-state drive optical drive unit 1715. The disk drive unit 1715 may include a non-transitory or tangible computer-readable medium 1740 in which one or more sets of instructions 1702, e.g., software, can be embedded. Further, the instructions 1702 may be used by the circuitry to perform one or more of the operations as described herein. The instructions 1702 may reside completely, or at least partially, within the memory 1705 and/or within the processor 1707 during execution by the circuitry of the computer system 1700. The database or any other databases described above may be stored in the memory 1705 and/or the disk unit 1715.

The memory 1705 and the processor 1707 also may include computer-readable media as discussed above. A "computer-readable medium," "computer-readable storage medium," and/or "machine readable medium," may include any device that includes, stores, or communicates, software for use by or in connection with an instruction executable by circuitry in the form of a system, apparatus, or device. The machine-readable medium may selectively be, but not limited to, an electronic, magnetic, optical, electromagnetic, infrared, or semiconductor system, apparatus, or device.

Additionally, the circuitry of the computer system 1700 may include an input device 1725, such as a keyboard or mouse, configured for a user to interact with any of the components of system 1700, including user selections or menu entries of display menus. It may further include a display 1730, such as a liquid crystal display (LCD), a cathode ray tube (CRT), or any other display suitable for conveying information. The display 1730 may act as an interface for the user to see the functioning of the processor 1707, or specifically as an interface with the software stored in the memory 1705 or the drive unit 1715.

The circuitry of the computer system 1700 may include a communication interface 1736 that enables communications via the communications network 125. The network 125 may include wired networks, wireless networks, or combinations thereof. The communication interface 1736 networks may enable communications via any number of communication standards, such as Ethernet AVB, 802.11, 802.17, 802.20, WiMax, or other communication standards.

Accordingly, the circuitry of the system may be realized in hardware, or a combination of hardware and software. The system may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a computer system with a computer program that, when being loaded and executed, controls the computer system such that it carries out the methods described herein. Such a programmed computer may be considered a special-purpose computer.

As described herein, any modules or processing boxes are defined to include hardware or some combination of hardware and software executable by the processor 1707. Software modules may include instructions stored in the memory 1705, or other memory device, that are executable by the processor 1707 or other processors. Hardware modules may include various devices, components, circuits, gates, circuit boards, and the like that are executable, directed, and/or controlled for performance by the processor 1707.

The system may also be embedded in a computer program product, which includes the features enabling the implementation of at least some of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The present disclosure has been described with reference to the accompanying drawings through particular preferred embodiments. However, it should be noted that the present disclosure is not limited to the illustrated and provided particular embodiments, but various modification may be made within the scope of the present disclosure.

Further, the embodiments of the present disclosure can be implemented in hardware or a combination of hardware and software. The hardware part can be implemented by a special logic; the software part can be stored in a memory and executed by a proper instruction execution system circuitry such as a microprocessor or a dedicated designed hardware. Those normally skilled in the art may appreciate that the above method and system can be implemented with a computer-executable instructions and/or control codes contained in the processor, for example, such codes provided on a bearer medium such as a magnetic disk, CD, or DVD-ROM, or a programmable memory such as a read-only memory (firmware) or a data bearer such as an optical or electronic signal bearer. The apparatus and its components in the present embodiments may be implemented by hardware circuitry, for example, a very large scale integrated circuit or gate array, a semiconductor such as logical chip or transistor, or a programmable hardware device such as a field-programmable gate array, or a programmable logical device, or implemented with software executed by various kinds of processors, or implemented by combination of the above hardware circuitry and software, for example, by firmware.

While various embodiments of the disclosure have been described, it will be apparent to those of ordinary skill in the art that many more embodiments and implementations are possible within the scope of the disclosure. Accordingly, the disclosure is not to be restricted except in light of the attached claims and their equivalents.

What is claimed is:

1. A system for real time power grid distribution network control, the system comprising:
   at least one processor; and
   at least one memory storing computer executable instructions,
   wherein the at least one memory comprises computer executable instructions executable with the at least one processor, to cause the system to:
   monitor in real time a power grid distribution network by receipt and real time analysis of measured power parameters of the power grid distribution network;
   detect an abnormal loading condition in the power grid distribution network based on real-time analysis of the measured power parameters of the power grid distribution network;
   perform, in response to the detected abnormal loading condition resulting from excessive real power, a reconfiguration analysis of the power grid distribution network based on the analysis of the measured power parameters to generate a reconfiguration plan for the detected abnormal loading condition,
   wherein the reconfiguration analysis is based on heuristic logic that combines both depth first trace upstream and downstream along a feeder of the power grid distribution network and breadth first division to other feeders within the power grid distribution system in accordance with a load transfer index that indicates an impact on a load balance from a load transfer and a number of switching operations during a load transfer.

2. The system according to claim 1, wherein the breadth first division is performed in response to failing to obtain, by performing the depth first trace, a result with a load transfer index lower than a predetermined index threshold.

3. The system according to claim 1, wherein a result obtained by performing the breadth first division is taken as the reconfiguration plan if the result has a number of switching operations lower than a predetermined number threshold.

4. The system according to claim 1, wherein the load transfer index is determined by $$LTI=[I_{capM}^{min}-(I_{rated}-I_{real}^{AT})]/I_{capM}^{min}*100\%$$

wherein LTI denotes the load transfer index; $I_{capM}^{min}$ denotes a minimum branch capacity margin among upstream branches of a boundary switch; $I_{rated}$ denotes a rated capacity of a branch with the minimum branch capacity margin; and $I_{real}^{AT}$ denotes a real capacity of the branch with the minimum branch capacity margin after performance of a load transfer.

5. The system according to claim 1, wherein the abnormal loading condition comprises an overloading condition or a heavy loading condition.

6. The system according to claim 1, wherein the real-time measurements on a power grid distribution network are real time data received from an Advanced Metering Infrastructure (AMI).

7. The system according to claim 1, wherein candidate solutions of the depth first search having the load transfer index within a predetermined range are used in the reconfiguration plan or candidate solutions of the breadth first search having the number of switching operations within a predetermined range are used in the reconfiguration plan.

8. A system for real time power grid distribution network control, the system comprising:
   at least one processor; and
   at least one memory storing computer executable instructions,
   wherein the at least one memory comprises computer executable instructions executable with the at least one processor, to cause the system to:
   monitor in real time a power grid distribution network by receipt and real time analysis of measured power parameters of the power grid distribution network;
   detect an abnormal loading condition in the power grid distribution network based on real-time analysis of the measured power parameters of the power grid distribution network;
   perform, in response to the detected abnormal loading condition resulting from excessive real power, a reconfiguration analysis of the power grid distribution network based on the analysis of the measured power parameters to generate a reconfiguration plan for the detected abnormal loading condition,
   wherein the reconfiguration analysis is based on heuristic logic that combines both depth first trace upstream and downstream along a feeder of the power grid distribution network and breadth first division to other feeders within the power grid distribution system, and
   wherein a result, obtained by performing the depth first trace, with a lowest load transfer index beyond a predetermined index threshold is taken as the reconfiguration plan, if each of results obtained by performing the breadth first division has a number of switching operations beyond a predetermined number threshold.

9. A method for real time power grid distribution network control, comprising:
   monitoring in real time a power grid distribution network by receipt and real time analysis of measured power parameters of the power grid distribution network;
   detecting an abnormal loading condition in the power grid distribution network based on real-time analysis of the measured power parameters of the power grid distribution network;
   performing, in response to the detected abnormal loading condition resulting from excessive real power, a reconfiguration analysis of the power grid distribution network based on the analysis of the measured power parameters; and
   generating a reconfiguration plan for the detected abnormal loading condition using heuristic logic that combines:
     tracing, with a depth first trace, upstream and downstream along a feeder of the power grid distribution network to determine candidate solutions of the depth first trace with a load transfer index within a predetermined range, wherein the load transfer index is indicative of an impact on a load balance from load transfer; and
     in response to the candidate solutions of the depth first trace having respective load transfer indices outside the predetermined range, dividing, with a breadth first division, among other feeders within the power grid distribution network to determine candidate solutions of the breadth first division with a number of switching operations within a predetermined range, wherein the number of switching operations occur during load transfer.

10. The method according to claim 9, further comprising using a partial load transfer plan generated based on performing either the depth first trace or the breadth first division as the reconfiguration plan if the candidate solutions of the depth first trace have respective load transfer indices outside the predetermined range and the candidate solutions of the breadth first division have respective number of switching operations outside the predetermined range.

11. The method according to claim 10, further comprising implementing the partial load transfer plan to cause a loading factor with a minimum value.

12. The method according to claim 9, performing the reconfiguration analysis of the power grid distribution network further comprises performing the heuristic logic when a reconfiguration optimization process based on direct current power flow fails to generate an acceptable reconfiguration plan to meet predetermined criteria, wherein the reconfiguration optimization process based on direct current power flow has an objective of minimizing a number of switching operations and has one or more of a network topology constraint, a power flow balance constraint, a switching times constraint and a line capacity constraint.

13. The method according to claim 12, further comprising refining the reconfiguration optimization process based on direct current power flow by performing iterative operations under a rating limitation on the power grid distribution network that is adjusted based on an alternate current power flow simulation result.

14. The method according to claim 12, further comprising determining that the reconfiguration optimization process based on direct current power flow failed to obtain the acceptable reconfiguration plan in response to any one of:
   no global optimal results being obtained; or
   none of results meeting knowledge based rules.

15. The method according to claim 9, wherein detecting an abnormal loading condition in a distribution network further comprises:
   calculating power flow based on the real-time measurements on the power grid distribution network; and determining, based on the calculated power flow, a loading factor indicating a loading condition.

16. The method according to claim 15, wherein detecting the abnormal loading condition comprises detecting when the loading factor is higher than a predetermined factor threshold.

17. The method according to claim 11, further comprising determining the loading factor by $$K = \frac{\sqrt{p^2 + q^2}}{S_r}$$

wherein K denotes the loading factor; p denotes active power of each equipment in the distribution network; q denotes reactive power of the each equipment in the distribution network; and $S_r$ denotes rated apparent power of the each equipment in the distribution network.

18. The method according to claim 9, wherein detecting the abnormal loading condition resulted from excessive real power comprising determining when a power factor under the detected abnormal loading condition is higher than a predetermined benchmark power factor threshold.

19. The method according to claim 9, further comprising: performing a reconfiguration on the distribution network based on the reconfiguration plan.

20. An apparatus for real time power grid distribution network control, comprising:

monitoring circuitry configured to monitor in real time a power grid distribution network by receipt and real time analysis of measured power parameters of the power grid distribution network;

loading condition detection circuitry configured to detect an abnormal loading condition in the power grid distribution network based on real-time analysis of the measured power parameters of the power grid distribution network; and analysis process performance circuitry configured to perform, in response to the detected abnormal loading condition resulting from excessive real power, a reconfiguration analysis of the power grid distribution network based on the analysis of the measured power parameters to generate a reconfiguration plan for the detected abnormal loading condition, wherein the analysis process performing circuitry is configured to perform the reconfiguration analysis based on heuristic logic that combines both depth first trace upstream and downstream along a feeder of the power grid distribution network and breadth first division to other feeders within the power grid distribution network, and wherein a result obtained by performing the depth first trace is taken as the reconfiguration plan if the result has a load transfer index lower than a predetermined index threshold or a result with the shortest impedance path between a branch in the detected abnormal loading condition and a boundary switch involved in the result is taken as the reconfiguration plan.

* * * * *